(12) United States Patent
Lin et al.

(10) Patent No.: US 11,637,051 B2
(45) Date of Patent: Apr. 25, 2023

(54) INTEGRATED DEVICE COUPLED TO A STEP HEAT SINK CONFIGURED TO PROVIDE SHIELDING

(71) Applicant: QUALCOMM Incorporated, San Diego, CA (US)

(72) Inventors: Hung-Wen Lin, Kaohsiung (TW); Sin-Shong Wang, Taipei (TW); Jen-Chun Chang, New Taipei (TW); Ajit Kumar Vallabhaneni, Carlsbad, CA (US); Keith Wang, Taoyuan (TW)

(73) Assignee: QUALCOMM INCORPORATED, San Diego, CA (US)

( * ) Notice: Subject to any disclaimer, the term of this patent is extended or adjusted under 35 U.S.C. 154(b) by 42 days.

(21) Appl. No.: 17/066,083

(22) Filed: Oct. 8, 2020

(65) Prior Publication Data
US 2021/0118764 A1 Apr. 22, 2021

Related U.S. Application Data

(60) Provisional application No. 62/923,108, filed on Oct. 18, 2019.

(51) Int. Cl.
 *H01L 23/367* (2006.01)
 *H01L 23/552* (2006.01)
 (Continued)

(52) U.S. Cl.
 CPC ........ *H01L 23/3675* (2013.01); *G06F 1/1656* (2013.01); *G06F 1/206* (2013.01);
 (Continued)

(58) Field of Classification Search
 CPC ............... H01L 23/053; H01L 23/3675; H01L 23/40; H01L 23/4087; H01L 23/427;
 (Continued)

(56) References Cited

U.S. PATENT DOCUMENTS

| 5,294,826 | A | * | 3/1994 | Marcantonio | ....... H01L 23/4334 |
| | | | | | 257/E23.128 |
| 5,731,952 | A | * | 3/1998 | Ohgami | ................ G06F 1/1635 |
| | | | | | 361/679.48 |
| 7,254,032 | B1 | * | 8/2007 | Xue | ...................... H01L 23/552 |
| | | | | | 361/764 |
| 9,253,925 | B1 | * | 2/2016 | Smith | ................ H05K 7/20409 |

(Continued)

FOREIGN PATENT DOCUMENTS

WO 2017105616 A1 6/2017

OTHER PUBLICATIONS

International Search Report and Written Opinion—PCT/US2020/055232—ISA/EPO—dated Feb. 11, 2021.

*Primary Examiner* — Zachary Pape
*Assistant Examiner* — Amir A Jalali
(74) *Attorney, Agent, or Firm* — Loza & Loza, LLP

(57) ABSTRACT

An assembly comprising a substrate, a first integrated device coupled to the substrate, a second integrated device coupled to the substrate, a frame coupled to the substrate such that the frame at least partially surrounds the first integrated device and the second integrated device, and a step heat sink coupled to the frame, such that the step heat sink is located over the first integrated device and the second integrated device. The assembly may further include a shield coupled to the frame such that the shield is located between the frame and the step heat sink. The shield may include a step shield. The assembly may further include a heat pipe coupled to the step heat sink.

30 Claims, 17 Drawing Sheets

(51) Int. Cl.
*G06F 1/16* (2006.01)
*G06F 1/20* (2006.01)
*H05K 7/20* (2006.01)
*H01L 23/427* (2006.01)
*H05K 1/02* (2006.01)

(52) U.S. Cl.
CPC ............ *H01L 23/552* (2013.01); *G06F 1/203* (2013.01); *H01L 23/367* (2013.01); *H01L 23/427* (2013.01); *H05K 1/0203* (2013.01); *H05K 7/20254* (2013.01); *H05K 7/20336* (2013.01)

(58) Field of Classification Search
CPC ................. H01L 23/552; H01L 21/52; H01L 21/4882; H01L 24/32; H01L 2924/00; H01L 2924/0002; H01L 2224/32245; H01L 2023/405; G06F 1/1656; G06F 1/20; G06F 1/203; H05K 7/20154; H05K 7/20336; H05K 2201/10674; H05K 2201/10371; H05K 2201/10098; H05K 2201/10522; H05K 9/0032; H05K 1/02; H05K 1/181
See application file for complete search history.

(56) References Cited

U.S. PATENT DOCUMENTS

| | | | |
|---|---|---|---|
| 9,405,335 B1* | 8/2016 | Boilard | G06F 1/20 |
| 2002/0172022 A1* | 11/2002 | DiBene, II | H01R 12/7088 |
| | | | 257/E23.09 |
| 2004/0231872 A1* | 11/2004 | Arnold | H01L 23/552 |
| | | | 257/E23.128 |
| 2008/0122067 A1* | 5/2008 | Wang | H01L 24/97 |
| | | | 257/706 |
| 2009/0091888 A1* | 4/2009 | Lin | H05K 9/0032 |
| | | | 361/704 |
| 2010/0276799 A1* | 11/2010 | Heng | H01L 23/10 |
| | | | 438/118 |
| 2011/0114294 A1* | 5/2011 | Degner | F28F 1/00 |
| | | | 165/185 |
| 2013/0329357 A1* | 12/2013 | Degner | H05K 5/02 |
| | | | 165/104.21 |
| 2016/0233141 A1* | 8/2016 | Hirobe | H01L 23/04 |
| 2017/0181265 A1* | 6/2017 | Hunt | H05K 1/0216 |
| 2017/0290209 A1* | 10/2017 | Craig | H05K 9/0032 |
| 2017/0374770 A1* | 12/2017 | Wang | H05K 9/0024 |
| 2018/0211925 A1* | 7/2018 | Tsai | H01L 21/563 |
| 2020/0203287 A1* | 6/2020 | Krefft | H01L 21/4814 |
| 2021/0185795 A1* | 6/2021 | Toyama | H05K 5/0073 |

* cited by examiner

GASKET AND TIM COUPLING

HEAT PIPE AND STEP HEAT SINK COUPLING

US 11,637,051 B2

1

INTEGRATED DEVICE COUPLED TO A STEP HEAT SINK CONFIGURED TO PROVIDE SHIELDING

CROSS-REFERENCE/CLAIM OF PRIORITY TO RELATED APPLICATION

The present application claims priority to and the benefit of U.S. Provisional Application No. 62/923,108, filed on Oct. 18, 2019, and titled, "INTEGRATED DEVICE COUPLED TO A STEP HEAT SINK CONFIGURED TO PROVIDE SHIELDING", which is hereby expressly incorporated by reference.

FIELD

Various features relate to integrated devices implemented with a heat sink.

BACKGROUND

FIG. 1 illustrates a first integrated device 110 and a second integrated device 120 coupled to a printed circuit board (PCB) 100. A first heat sink 112 is positioned on top of the first integrated device 110. The first heat sink 112 is configured to dissipate heat away from the first integrated device 110. A second heat sink 122 is positioned on top of the second integrated device 120. The second heat sink 122 is configured to dissipate heat away from the second integrated device 120. There is an ongoing need to improve the performance of heat dissipating devices.

SUMMARY

Various features relate to integrated devices implemented with a heat sink.

One example provides an assembly that includes a substrate, a first integrated device coupled to the substrate, a second integrated device coupled to the substrate, a frame coupled to the substrate, and a step heat sink coupled to the frame. The frame at least partially surrounds the first integrated device and the second integrated device. The step heat sink is located over the first integrated device and the second integrated device.

Another example provides an apparatus that includes a substrate, a first integrated device coupled to the substrate, a second integrated device coupled to the substrate, a frame coupled to the substrate, and means for heat dissipation coupled to the frame. The means for heat dissipation is located over the first integrated device and the second integrated device. The frame at least partially surrounds the first integrated device and the second integrated device

BRIEF DESCRIPTION OF THE DRAWINGS

Various features, nature and advantages may become apparent from the detailed description set forth below when taken in conjunction with the drawings in which like reference characters identify correspondingly throughout.

2

Figure 4:
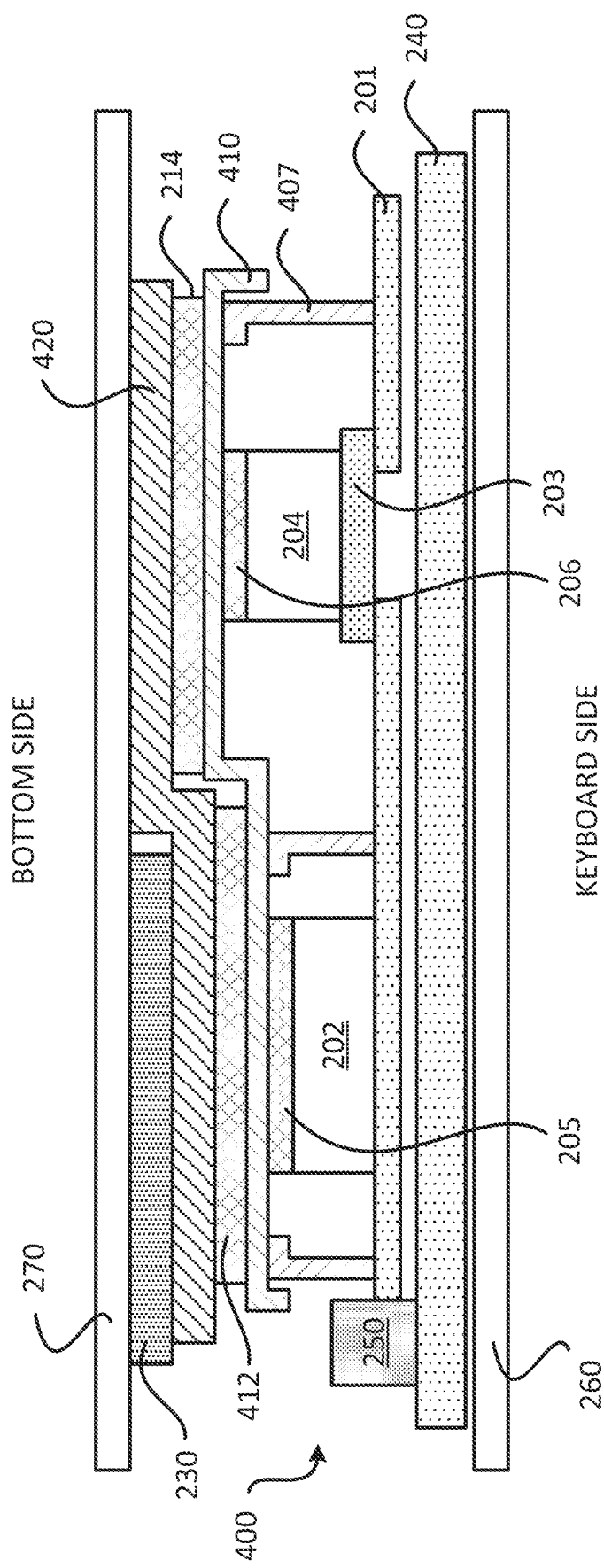

FIG. 4 illustrates a view of an assembly that includes integrated devices, a step shield, a step heat sink and a heat pipe.

Figure 5:
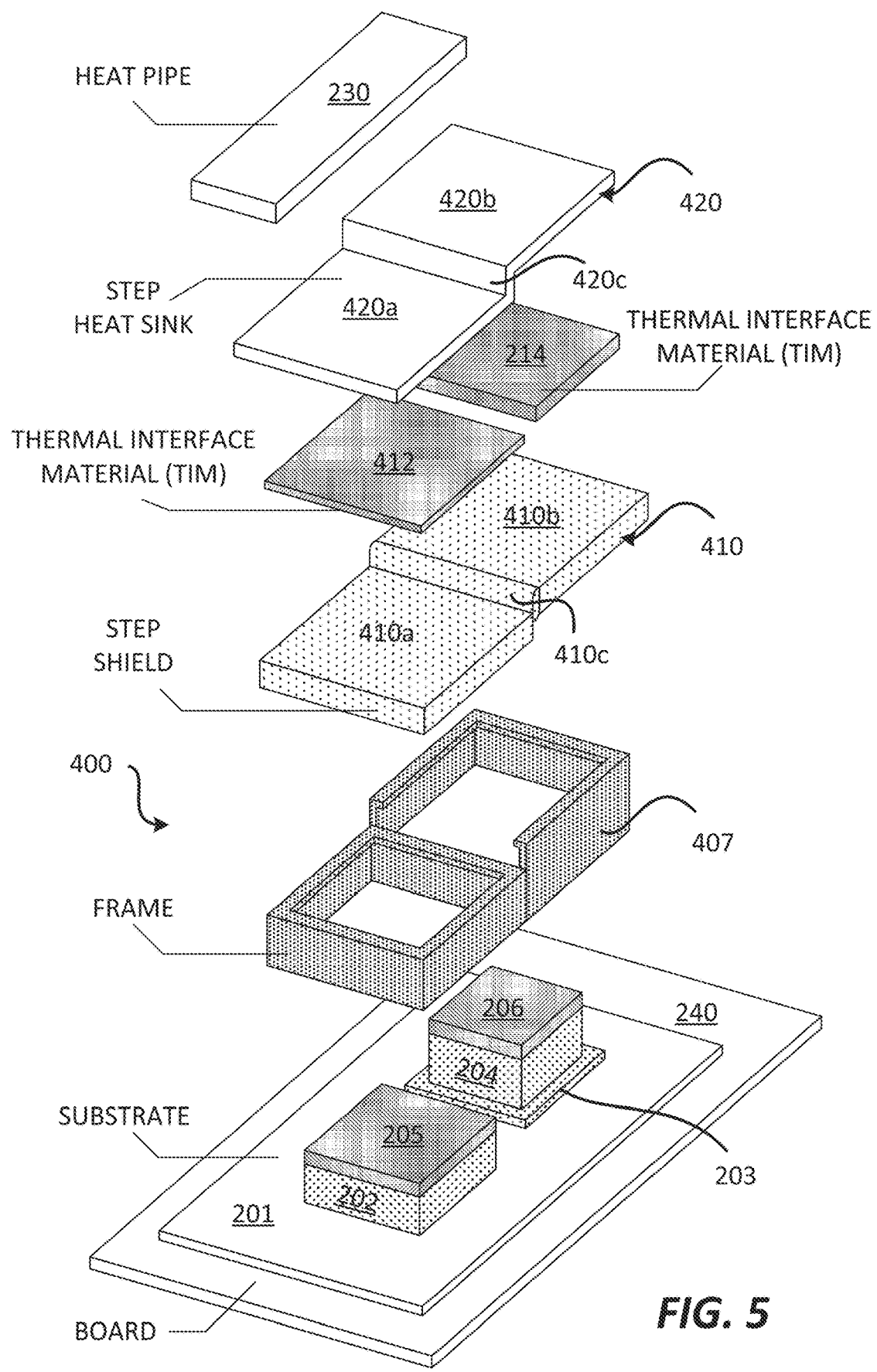

FIG. 5 illustrates an assembly view of an assembly that includes integrated devices, a step shield, a step heat sink and a heat pipe.

Figure 6:
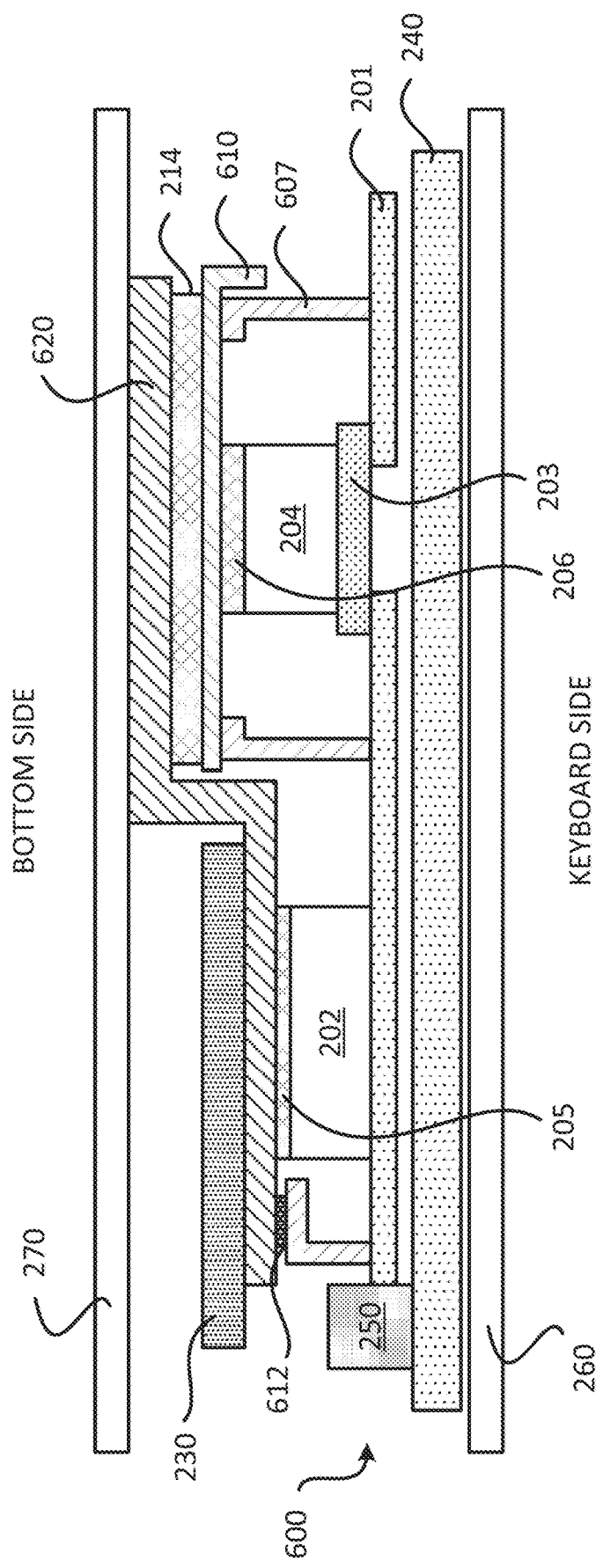

FIG. 6 illustrates a view of an assembly that includes integrated devices, a shield, a step heat sink and a heat pipe.

Figure 7:
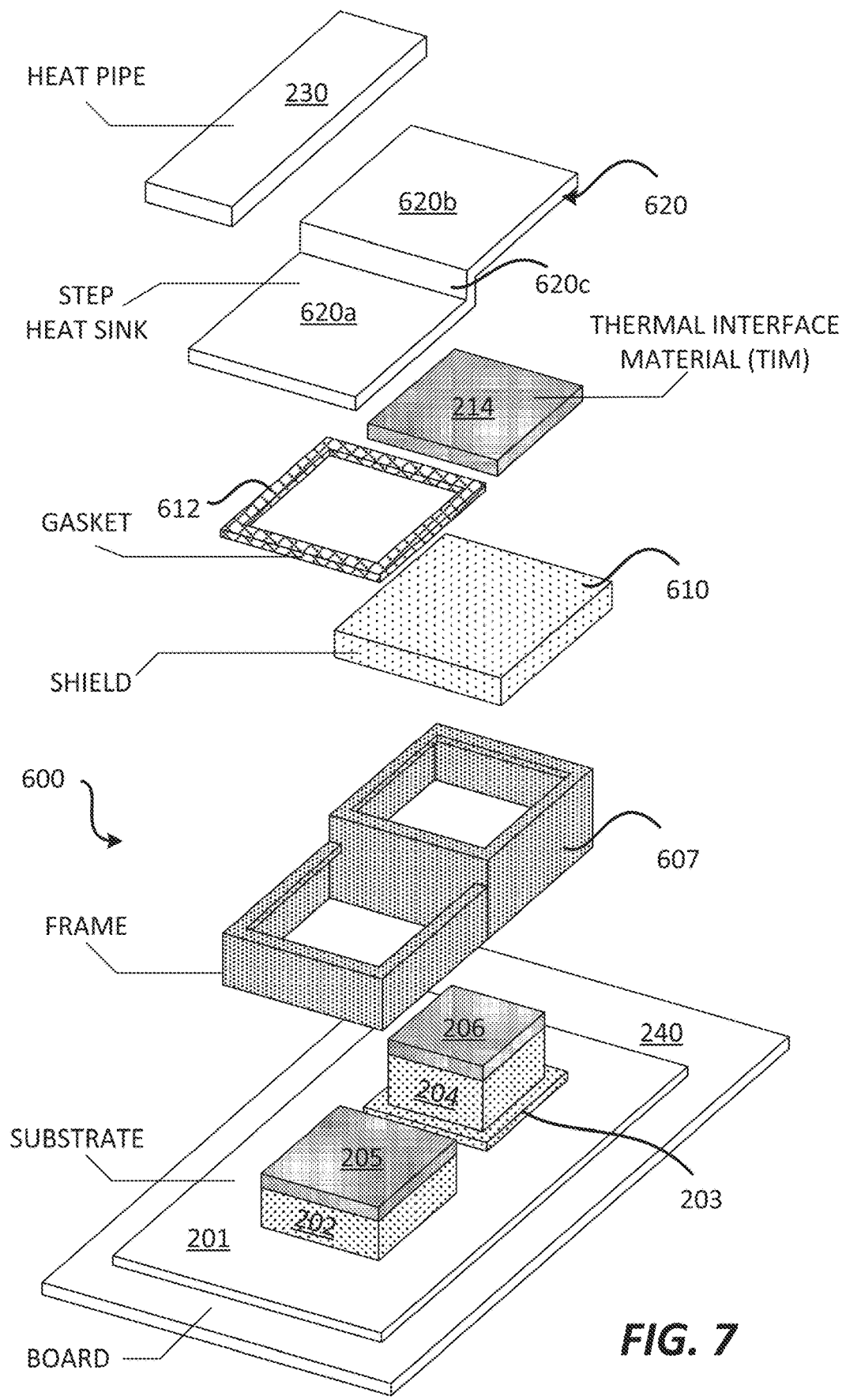

FIG. 7 illustrates an assembly view of an assembly that includes integrated devices, a shield, a step heat sink and a heat pipe.

Figure 8:
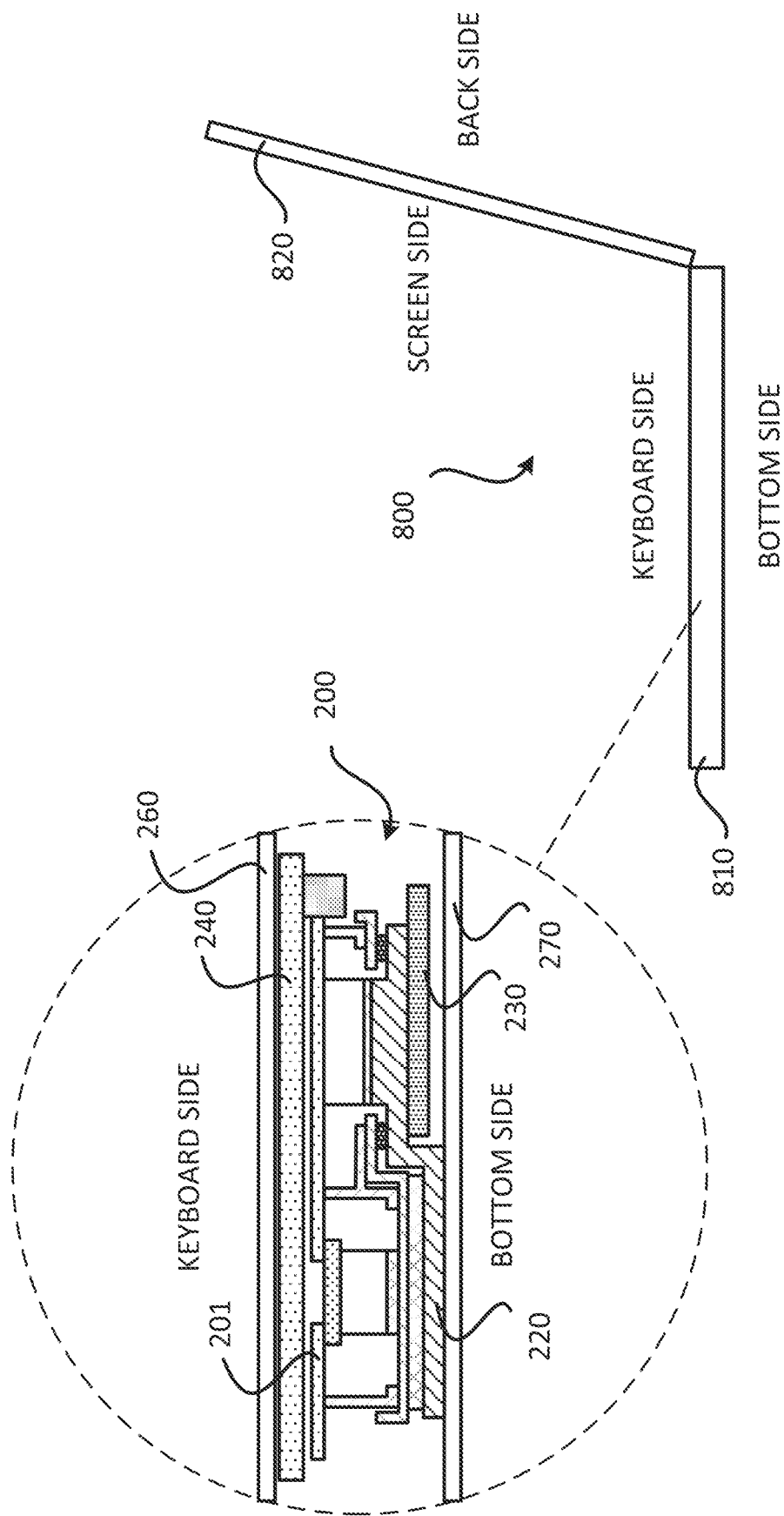

FIG. 8 illustrates a view of an assembly that includes integrated devices, a step shield, a step heat sink and a heat pipe, implemented in a computer device.

Figure 10:
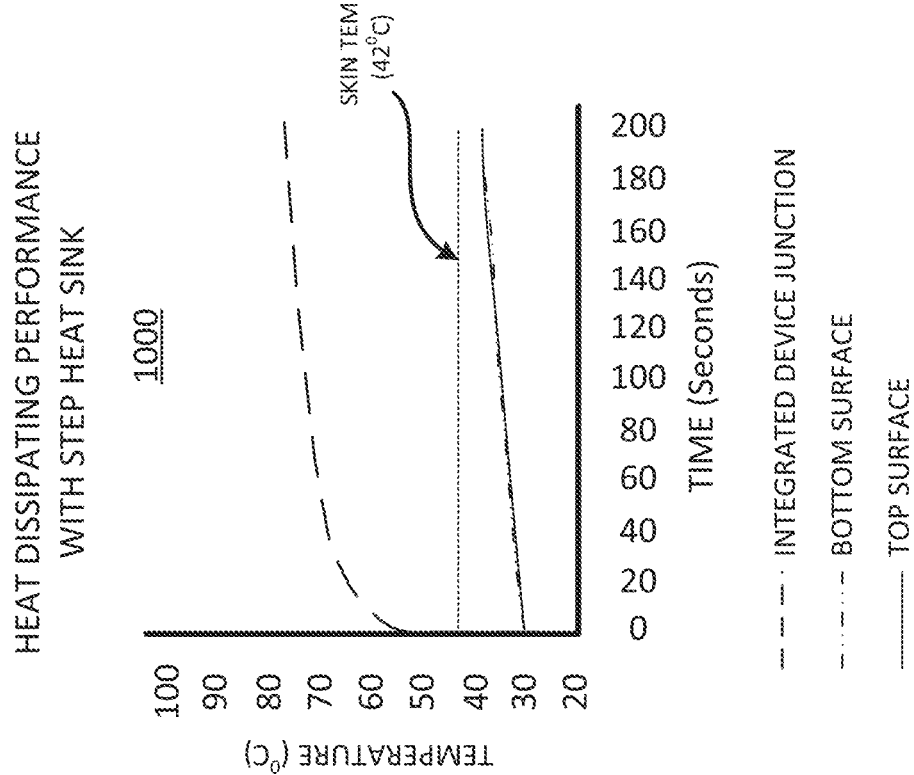
Figure 9:
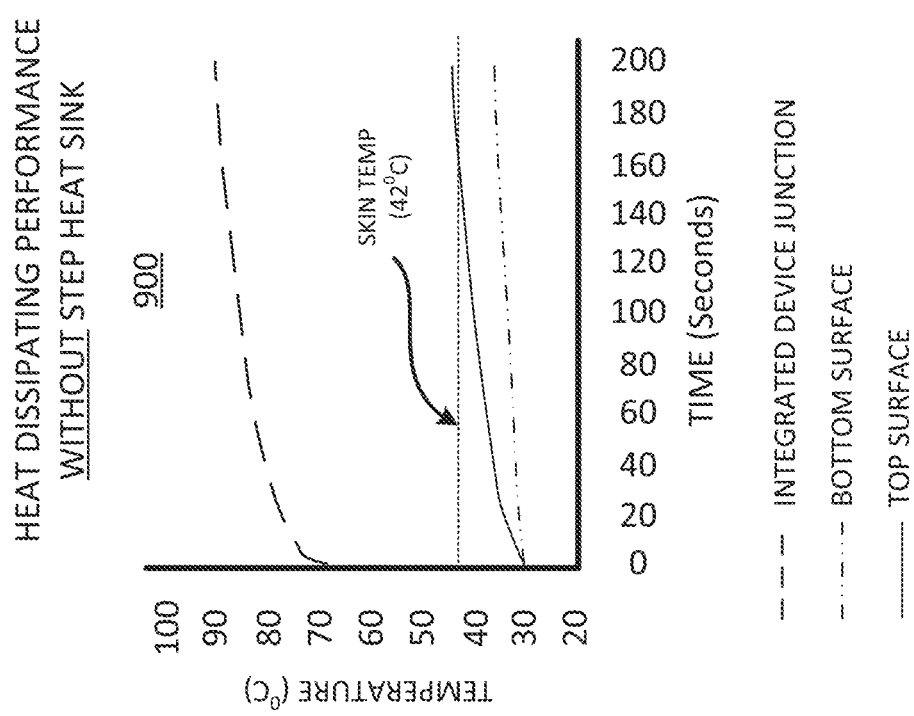

FIGS. 9-10 illustrate graphs showing heat dissipating performances of assemblies without a step heat sink and with a step heat sink.

Figure 11:
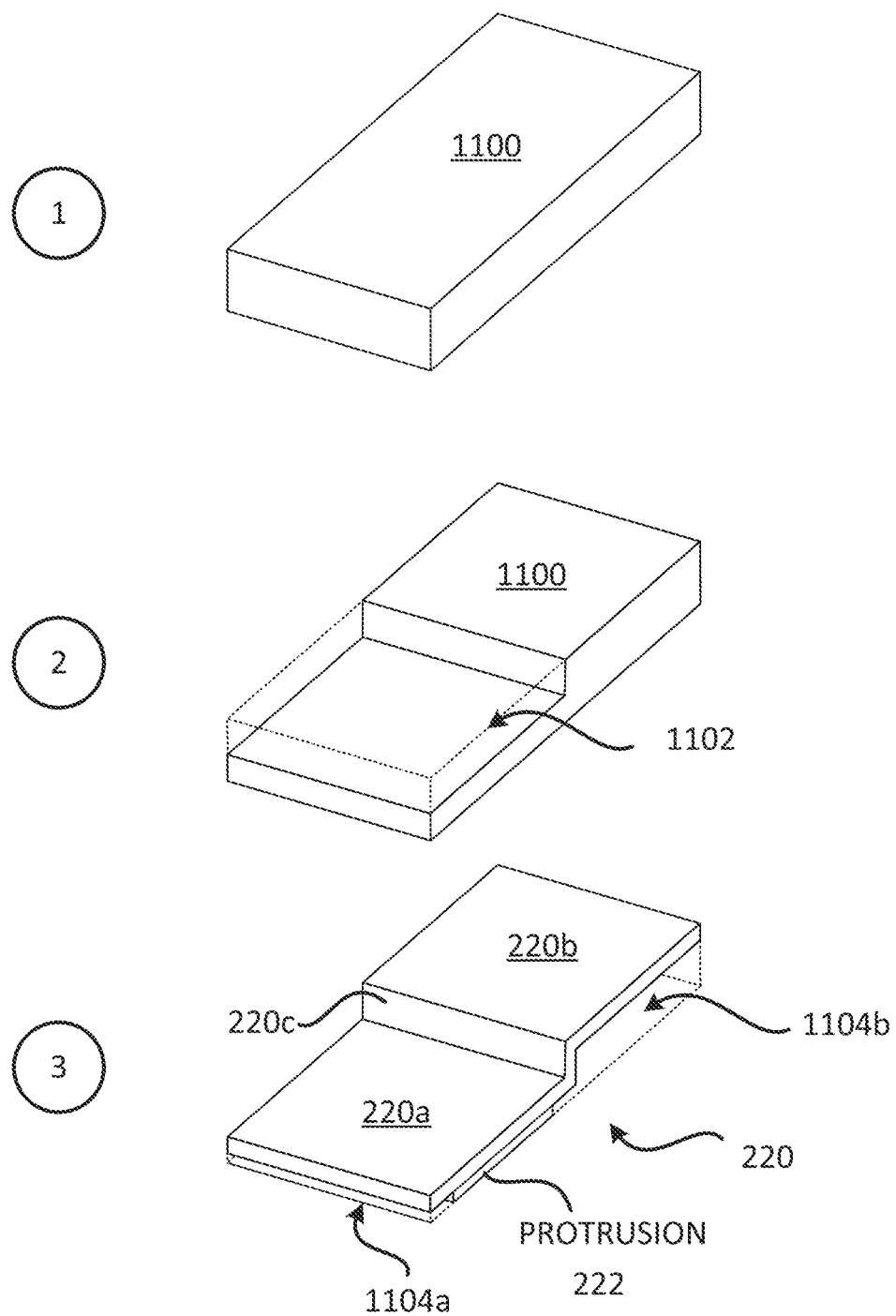

FIG. 11 illustrates an exemplary sequence for fabricating a step heat sink.

Figure 12:
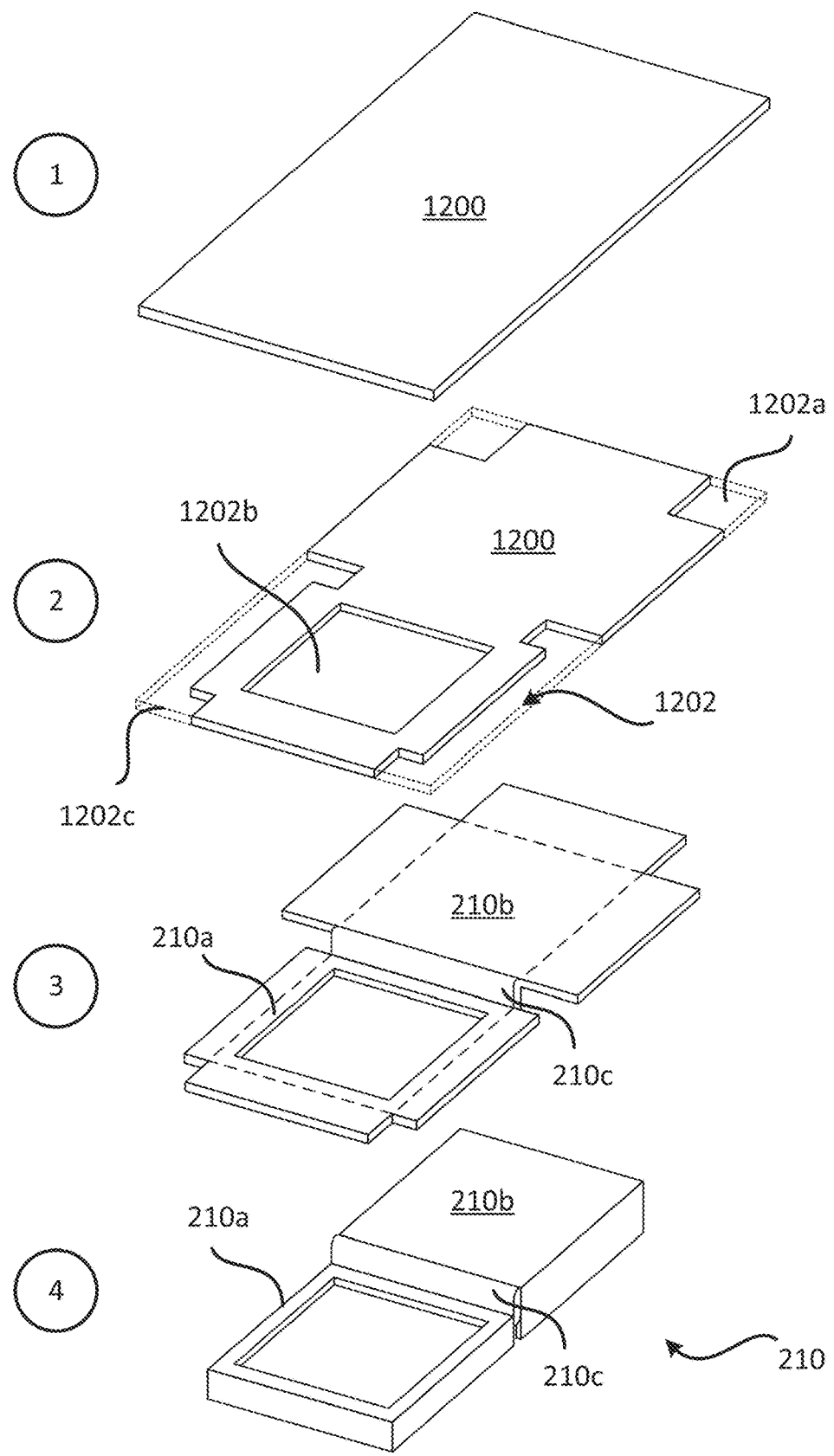

FIG. 12 illustrates an exemplary sequence for fabricating a step shield.

FIGS. 13A-13D illustrate an exemplary sequence for fabricating an assembly that includes integrated devices, a step shield, a step heat sink and a heat pipe.

Figure 14:
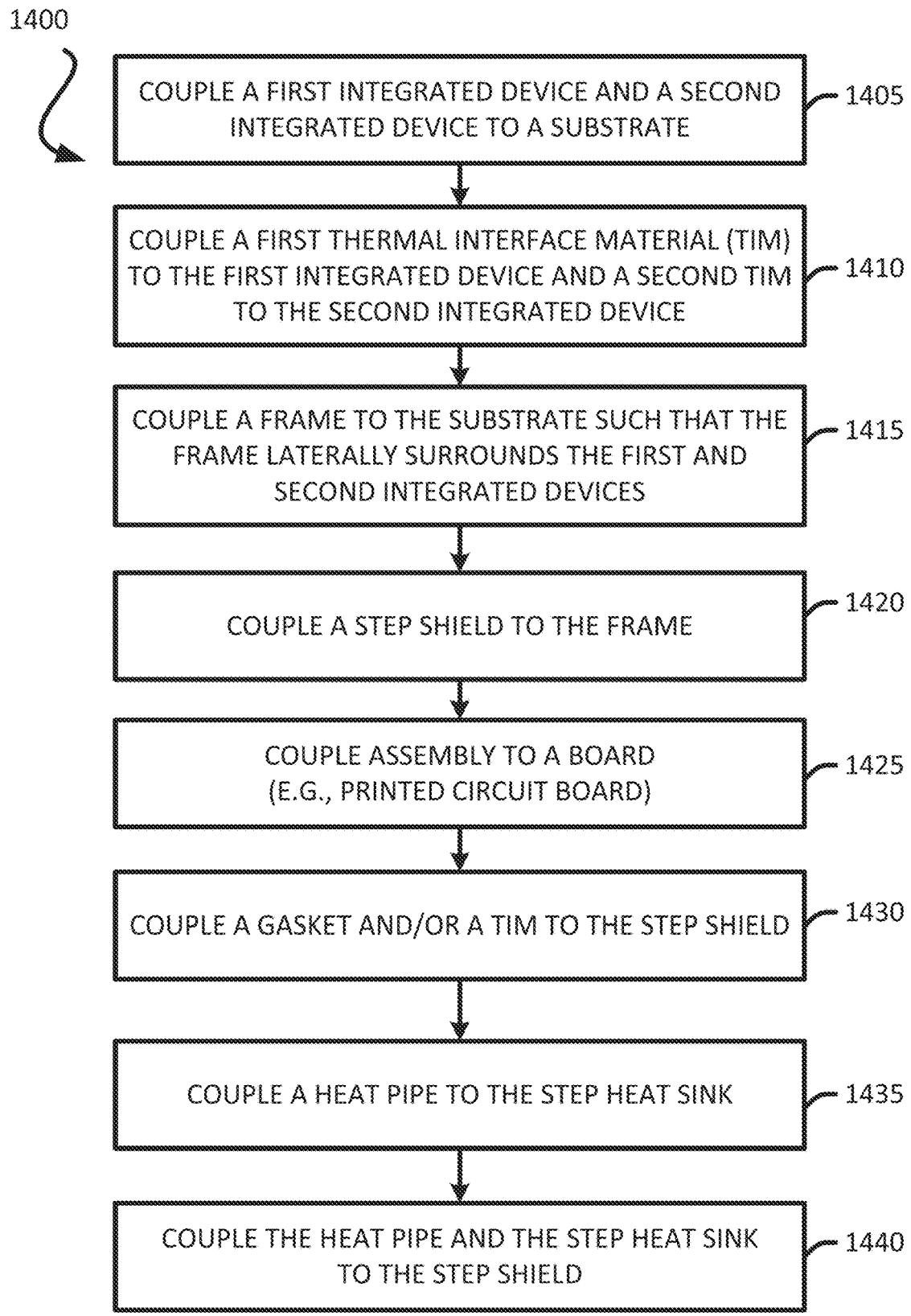

FIG. 14 illustrates an exemplary flow diagram of a method for fabricating an assembly that includes integrated devices, a step shield, a step heat sink and a heat pipe.

Figure 15:
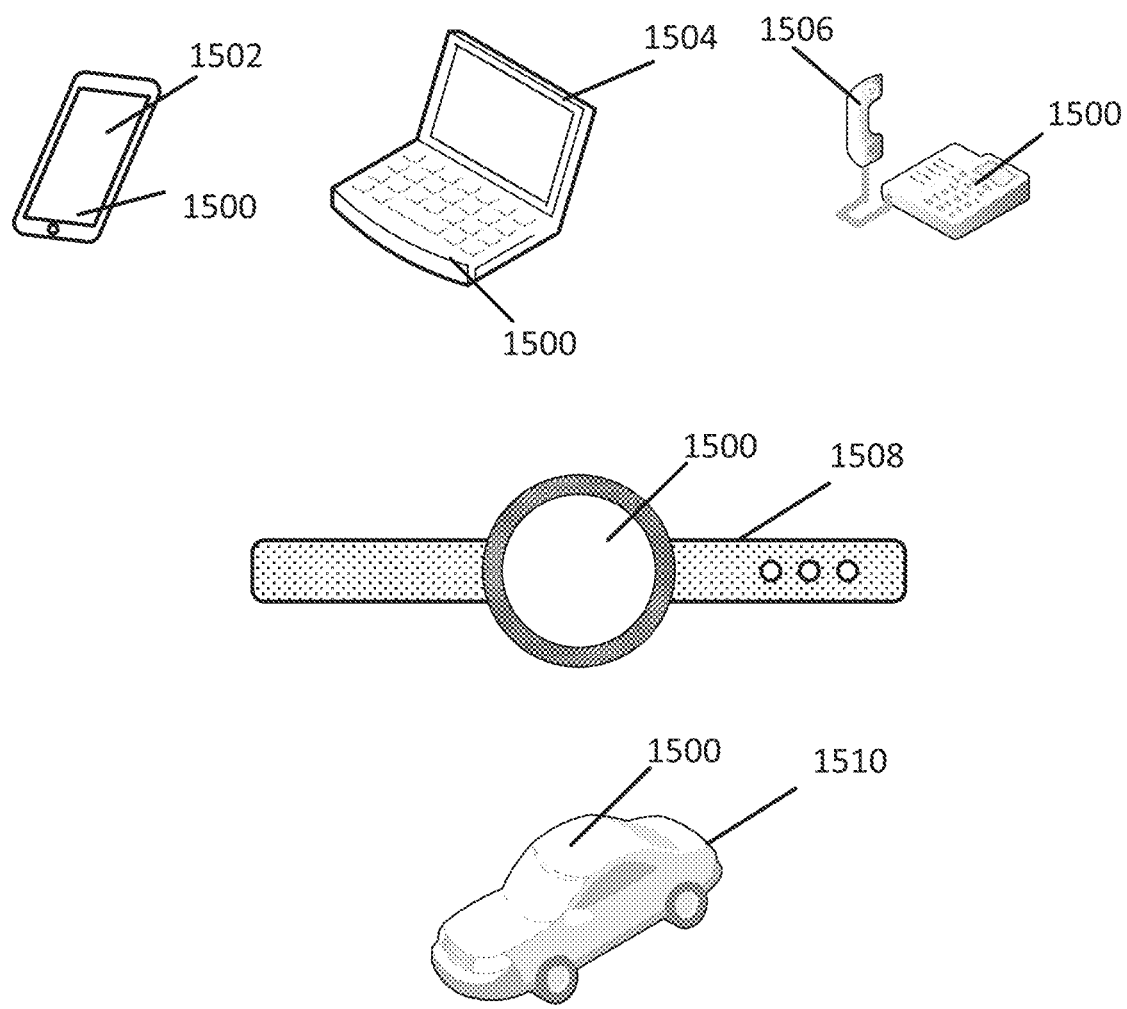

FIG. 15 illustrates various electronic devices that may integrate a die, an integrated device, an integrated passive device (IPD), a passive component, a package, and/or a device package described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an assembly comprising a substrate, a first integrated device coupled to the substrate, a second integrated device coupled to the substrate, a frame coupled to the substrate such that the frame at least partially surrounds the first integrated device and the second integrated device, and a step heat sink coupled to the frame, such that the step heat sink is located over the first integrated device and the second integrated device. The assembly may further include a shield coupled to the frame such that the shield is located between the frame and the step heat sink. The shield may include a step shield. The step heat sink may be configured to provide shielding (e.g., electromagnetic interference shielding). The assembly may further include a heat pipe coupled to the step heat sink. As will be further described below, the step heat sink may be configured to help provide improved heat dissipation for the first integrated device and/or the second integrated device, while also reducing how quickly a surface temperature of a device that includes the assembly, increases.

Exemplary Assembly Comprising Integrated Devices and a Step Heat Sink

Figure 1:
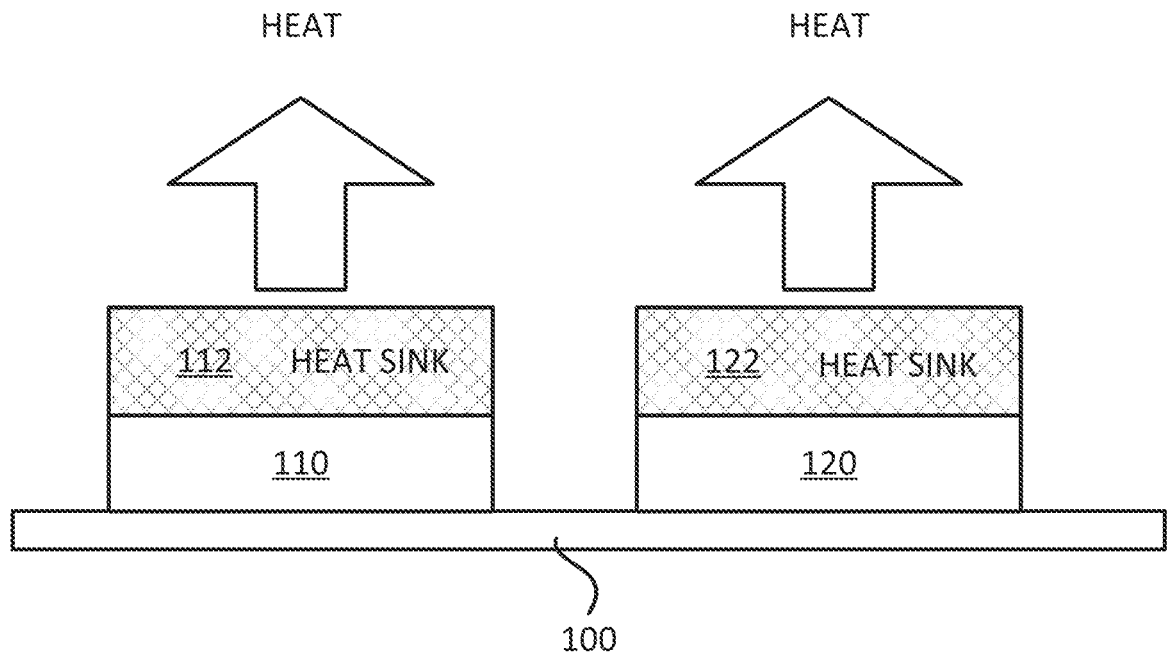
FIG. 1 illustrates a profile view of heat sinks coupled to integrated devices.
Figure 2:
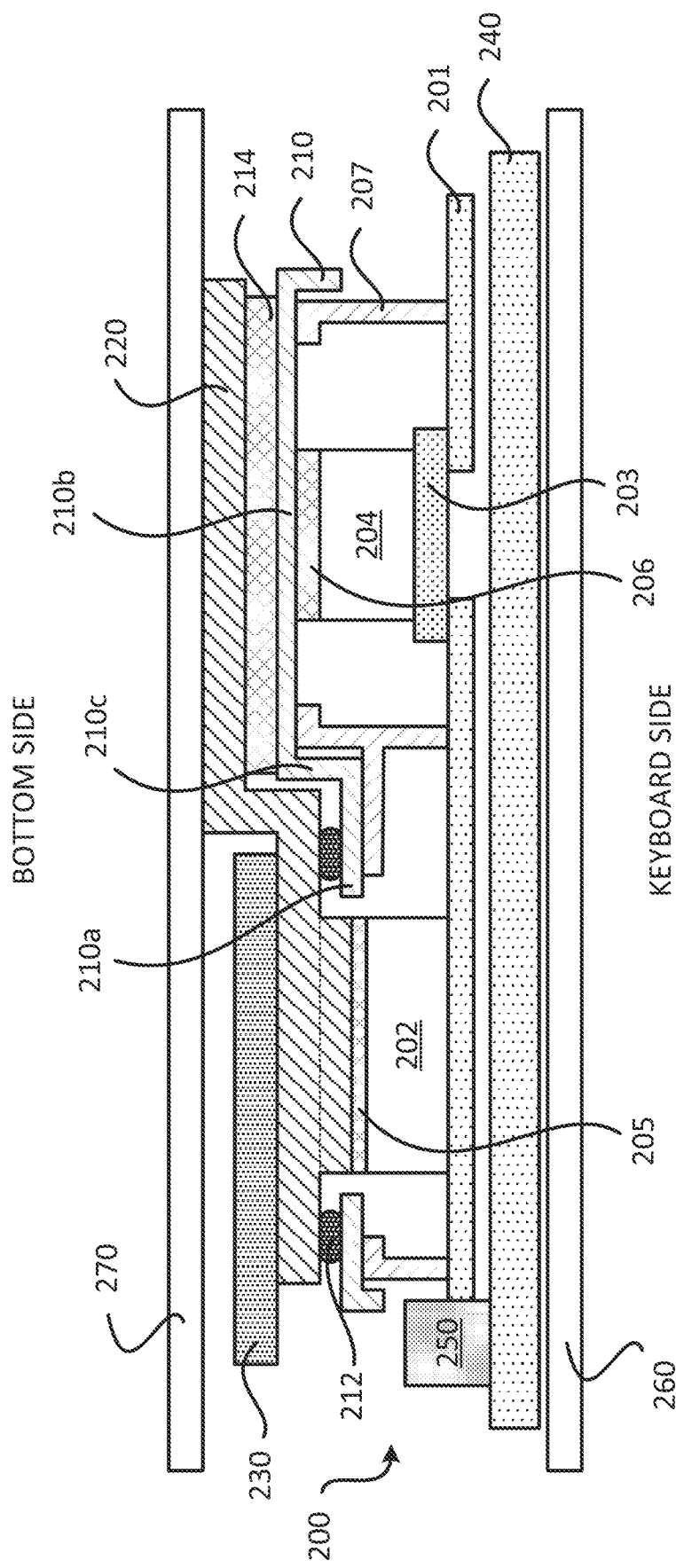
FIG. 2 illustrates a view of an assembly that includes integrated devices, a step shield, a step heat sink and a heat pipe.

FIG. 2 illustrates an assembly 200 that includes integrated devices and a step heat sink. As shown in FIG. 2, the assembly 200 includes a substrate 201, a first integrated device 202, a second integrated device 204, a frame 207, a shield 210, a step heat sink 220 and a heat pipe 230. As will be further described below in detail, the first integrated device 202 is coupled to the substrate 201, the second integrated device 204 is coupled to the substrate 201, the frame 207 is coupled to the substrate 201 such that the frame 207 at least partially surrounds (e.g., laterally surrounds) the first integrated device 202 and the second integrated device 204, and the step heat sink 220 is coupled to the frame 207, such that the step heat sink 220 is located over the first integrated device 202 and the second integrated device 204. The step heat sink 220 is configured to help dissipate heat away from the first integrated device 202 and away from the second integrated device 204.

The substrate 201 may be a laminate substrate. The substrate 201 may include interconnects (pads, traces, vias), which are not shown. The first integrated device 202 and the second integrated device 204 are each coupled to a first surface of the substrate 201. The first integrated device 202 and the second integrated device 204 may be coupled to interconnects of the substrate 201 through a plurality of solder interconnects and/or pillar interconnects. For example, the second integrated device 204 is coupled to the substrate 201 through a plurality of solder interconnects 203. The plurality of solder interconnects 203 may include a land grid array (LGA). The first integrated device 202 and/or the second integrated device 204 may include a die (e.g., bare die). An integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

Figure 3:
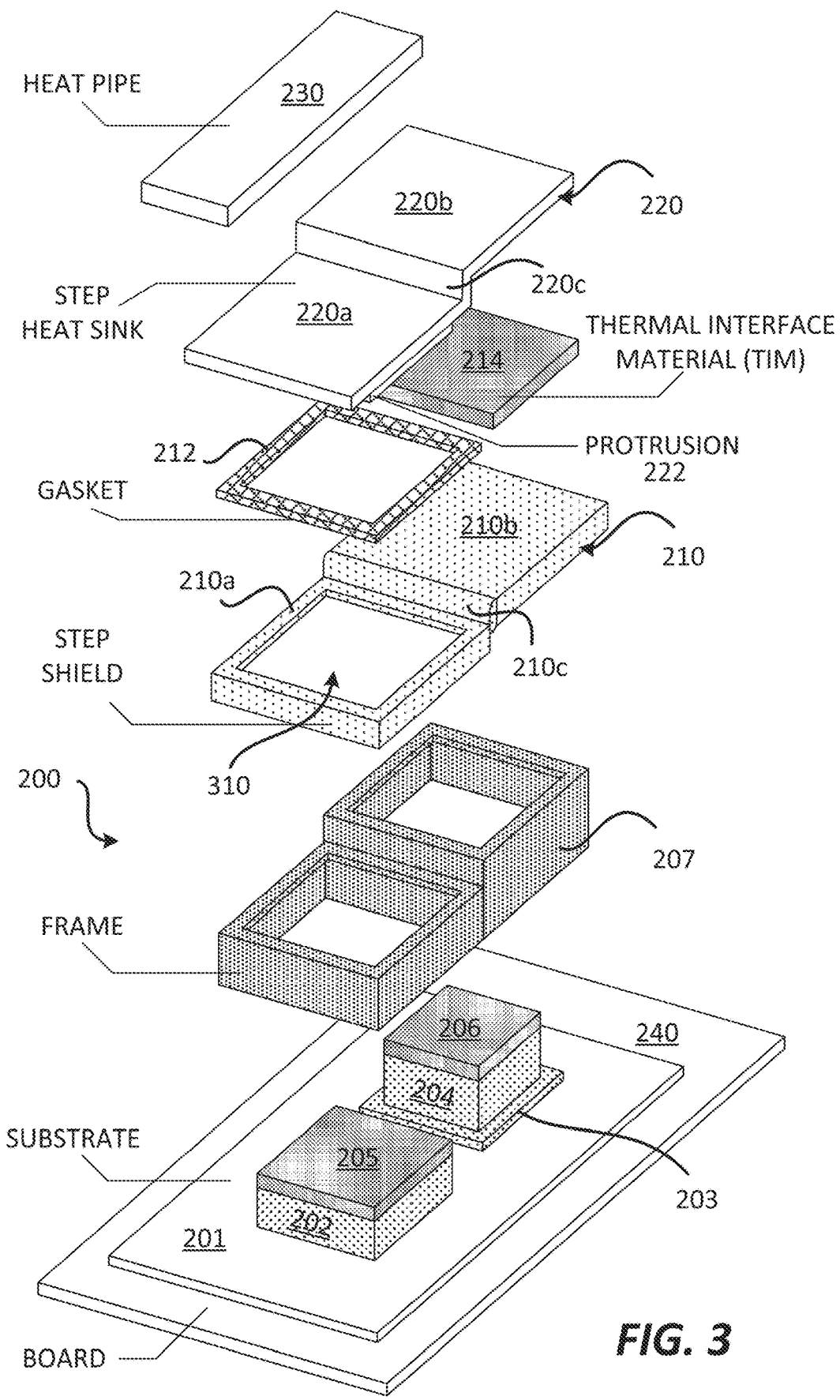
FIG. 3 illustrates an assembly view of an assembly that includes integrated devices, a step shield, a step heat sink and a heat pipe.

FIG. 3 illustrates an assembly view of the assembly 200. FIGS. 2 and 3 will be described in conjunction with each other. A first thermal interface material (TIM) 205 is coupled to the first integrated device 202. The first TIM 205 may be coupled to and/or located over a back side (e.g., top side) of the first integrated device 202. A second thermal interface material (TIM) 206 is coupled to the second integrated device 204. The second TIM 206 may be coupled to and/or located over a back side (e.g., top side) of the second integrated device 204.

The frame 207 is coupled to the first surface of the substrate 201. The frame 207 is coupled to the substrate 201 such that the frame 207 at least partially surrounds (e.g., laterally surround) the first integrated device 202 and the second integrated device 204. In some implementations, the frame 207 surrounds the first integrated device 202 and the second integrated device 204 such that the first integrated device 202 is located in a first compartment and the second integrated device 204 is located in a second compartment. The frame 207 may include a first opening over the first integrated device 202 and a second opening over the second integrated device 204. The frame 207 may include an electrically conductive material. The frame 207 may be made of one component or may be made of several components. The frame 207 may be a continuous frame and/or a contiguous frame.

The shield 210 is coupled to the frame 207 such that the shield 210 is located over the first integrated device 202 and the second integrated device 204. The shield 210 is configured to provide electromagnetic interference (EMI) shielding. The shield 210 may be a step shield. The shield 210 may be a means for shielding (e.g., EMI shielding). The shield 210 may be configured to be electrically coupled to the frame 207 such that both the shield 210 and the frame 207 are configured to provide shielding (e.g., EMI shielding). The shield 210 and/or the frame 207 may be configured to be coupled to ground.

The shield 210 includes a first shield portion 210a, a second shield portion 210b, and a third shield portion 210c. The first shield portion 210a, the second shield portion 210b, and the third shield portion 210c may be continuous and/or contiguous portions of the shield 210. In some implementations, the shield 210 may include separate portions. For example, in some implementations, at least two portions from the first shield portion 210a, the second shield portion 210b, and the third shield portion 210c may be separate portions. It is noted that how the shield 210 is divided into portions is arbitrary. Different implementations may divide the shield 210 into different portions and/or into a different number of portions. The portions may have different shapes and/or sizes.

FIG. 2 illustrates that the shape and design of the shield 210 is such that the shield 210 includes a step shield, where at least two surfaces (e.g., horizontal surface, surface approximately parallel to a back surface of the integrated device, surface coupled to a TIM, surface coupled to frame, surface coupled to heat sink) facing in the same direction are non-planar to each other. For example, a first surface (e.g., top surface) of the first shield portion 210a over the first integrated device 202 is non-planar to a first surface (e.g., top surface) of the second shield portion 210b over the second integrated device 204. Similarly, a second surface (e.g., bottom surface) of the first shield portion 210a over the first integrated device 202 may be non-planar to a second surface (e.g., bottom surface) of the second shield portion 210b over the second integrated device 204. The shield 210 may be a step shield that is designed such that the step shield may be coupled to two non-planar surfaces. In some implementations, the two non-planar surfaces that the step shield may be coupled to, are approximately parallel to one another.

As shown in FIGS. 2, 4 and/or 6, and further described below, in some implementations, the second surface (e.g., bottom surface) of the first shield portion (e.g., 210a, 410a) that is coupled to the frame (e.g., 207, 407) and/or the first TIM 205, may be non-planar to the second surface (e.g., bottom surface) of the second shield portion 210b that is coupled to the second TIM 206.

In FIG. 2, the first shield portion 210a is coupled to the third shield portion 210c, and the second shield portion 210b is coupled to the third shield portion 210c such that the third shield portion 210c is between the first shield portion 210a and the second shield portion 210b. The second shield portion 210b is non-planar to the first shield portion 210a. FIG. 2 also illustrate that the shield 210 includes an opening above the first integrated device 202.

The step heat sink 220 is coupled to the shield 210 and/or the first integrated device 202. In particular, a portion of the step heat sink 220 is coupled to the shield 210 through a TIM 214, and another portion of the step heat sink 220 is coupled to the first integrated device 202 through the first TIM 205.

The step heat sink 220 may be configured to be electrically coupled to the frame 207 and/or the shield 210 such that, the step heat sink 220, the shield 210 and/or the frame 207 are configured to provide shielding (e.g., EMI shielding). The means for shielding (e.g., means for EMI shielding) may include the step heat sink 220, the shield 210 and/or the frame 207. The step heat sink 220, the shield 210 and/or the frame 207 may be configured to be coupled to ground.

The step heat sink 220 includes a first heat sink portion 220a, a second heat sink portion 220b, and a third heat sink portion 220c. The step heat sink 220 may be a means for heat dissipation. The first heat sink portion 220a, the second heat sink portion 220b, and the third heat sink portion 220c may be continuous and/or contiguous portions of the step heat sink 220. In some implementations, the step heat sink 220 may include separate portions. For example, in some implementations, at least two portions from the first heat sink portion 220a, the second heat sink portion 220b, and the third heat sink portion 220c may be separate portions. It is noted that how the step heat sink 220 is divided into portions is arbitrary. Different implementations may divide the step heat sink 220 into different portions and/or into a different number of portions. The portions of the step heat sink 220 may have different sizes and/or shapes.

The first heat sink portion 220a is coupled to the third heat sink portion 220c. The second heat sink portion 220b is coupled to the third heat sink portion 220c, such that the third heat sink portion 220c is between the first heat sink portion 220a and the second heat sink portion 220b, where the second heat sink portion 220b is non-planar to the first heat sink portion 220a.

FIG. 2 illustrates that the shape and design of the step heat sink 220 is such that at least two surfaces (e.g., horizontal surface, surface approximately parallel to a back surface of the integrated device, surface coupled to a TIM, surface coupled to shield, surface coupled to integrated) facing in the same direction are non-planar to each other. For example, a first surface (e.g., top surface) of the first heat sink portion 220a over the first integrated device 202 is non-planar to a first surface (e.g., top surface) of the second heat sink portion 220b over the second integrated device 204. Similarly, a second surface (e.g., bottom surface) of the first heat sink portion 220a over the first integrated device 202 may be non-planar to a second surface (e.g., bottom surface) of the second heat sink portion 220b over the second integrated device 204. The step heat sink 220 may be designed such that the step heat sink 220 may be coupled to two non-planar surfaces. In some implementations, the two non-planar surfaces that the step heat sink 220 may be coupled to, are approximately parallel to one another.

As shown in FIGS. 2, 4 and/or 6, and further described below, in some implementations, the second surface (e.g., bottom surface) of the first heat sink portion (e.g., 220a, 420a, 620a) that is coupled to the first TIM 205, the gasket 212, the gasket 612, the first shield portion (210a, 410a) and/or the TIM 414, may be non-planar to the second surface (e.g., bottom surface) of the second heat sink portion 220b that is coupled to the TIM 214 and/or the second shield portion (e.g., 210b, 410b).

The first heat sink portion 220a includes a protrusion 222 that is located over the first integrated device 202. The protrusion 222 may help reduce the thickness of the first TIM 205 between the first heat sink portion 220a and the first integrated device 202. The first heat sink portion 220a is coupled to the first TIM 205. The second heat sink portion 220b is located over the second integrated device 204. The second heat sink portion 220b is coupled to the TIM 214. The step heat sink 220 may be coupled to the shield 210 through a gasket 212. For example, the first heat sink portion 220a may be coupled to the first shield portion 210a through the gasket 212.

The step heat sink 220 may be configured to be electrically coupled to the shield 210. In some implementations, the step heat sink 220 may be configured to also provide shielding (e.g., EMI shielding). The step heat sink 220 may be configured to be electrically coupled to the shield 210 through the gasket 212. Thus, in some implementations, the gasket 212 may include material that is electrically conductive. The step heat sink 220 may be configured to be coupled to ground.

The heat pipe 230 is coupled to the step heat sink 220. The heat pipe 230 may be a means for phase transition heat dissipation. The heat pipe 230 may be a heat transfer device that is configured to help dissipate heat away through thermal conductivity and phase transition. The heat pipe 230 may include a liquid inside a casing of the heat pipe 230. The liquid inside the heat pipe 230 may cycle through a liquid phase and a vapor to help dissipate heat. The heat pipe 230 is coupled to the first heat sink portion 220a such that the heat pipe 230 is located over the first integrated device 202. The size and shape of the heat pipe 230 such that a top surface is at or below a top surface of the second heat sink portion 220b. In some implementations, the heat pipe 230 is located over the first integrated device 202 because the first integrated device 202 may be configured to generate more heat than the second integrated device 204, and in such instances, it may be more important, more critical, more relevant, and/or more productive overall, to focus the overall design of the assembly to dissipate heat away from the first integrated device 202. In such designs, heat may still be dissipated away from the second integrated device 204.

As will be further illustrated and described below in FIGS. 9 and 10, the use of a step heat sink helps reduce the overall temperature (e.g., junction temperature) of the integrated device (e.g., first integrated device, second integrated device) by dissipating more heat away from the integrated device. In addition, the use of the board 240 helps spread out the heat towards a greater area, thus reducing the rate at which temperature increases on the outer surfaces of a device that includes the assembly (e.g., 200).

The assembly 200 may be coupled to a connector 250. The connector 250 is coupled to the board 240. The board 240 may be a printed circuit board (PCB) and/or a system board. The connector 250 may be coupled to the substrate 201 and/or interconnects (e.g., pins) of the substrate 201. The connector 250 is configured to provide one or more electrical paths between the substrate 201 and the board 240. The assembly 200 or part of the assembly 200 may be configured to operate as a M.2 module. The substrate 201 may be a M.2 compatible substrate. The substrate 201 may be a board.

The assembly 200 may be implemented in a device, such as a computer device (e.g., laptop, tablet), such that the substrate facing side of the assembly 200 faces the front side (e.g., keyboard side, screen side) of the device, while the step heat sink facing side of the assembly 200 faces the back side (e.g., bottom side) of the device. FIG. 2 illustrates that the substrate (e.g., 201) facing side of the assembly 200 faces the keyboard side 260 of a device, while the step heat sink (e.g., 220) facing side of the assembly 200 faces the bottom side 270 of the device. However, different implementations may implement the assembly in a device differently (e.g., different location, different orientation, different configuration). The use of a step heat sink and/or a step shield may be implemented when two or more integrated device with different heights are used.

The size, dimensions, shapes, locations, and orientations of the various components shown in FIG. 2 are exemplary and are not necessarily to scale. For example, the first integrated device 202 is shown as having a lower height than the second integrated device 204. In some implementations, the second integrated device 204 may be taller and/or bigger. In addition, there may be other components that are part of the assembly 200 that are not shown.

As mentioned above, FIG. 3 illustrates an assembly view of the assembly 200. The assembly 200 may be coupled to the board 240. As shown in FIG. 3, the first integrated device 202 and the second integrated device 204 are coupled to the substrate 201. The second integrated device 204 is coupled to the substrate 201 through a plurality of solder interconnects 203 (e.g., LGA). The first TIM 205 is coupled to a top portion (e.g., back side) of the first integrated device 202. The second TIM 206 is coupled to a top portion (e.g., back side) of the second integrated device 204. The frame 207 is configured to be coupled to the substrate 201 such that the frame 207 at least partially surrounds (e.g., laterally surrounds) the first integrated device 202 and the second integrated device 204.

The shield 210 includes an opening 310. The shield 210 is configured to be coupled to the frame 207 such that the shield 210 is located over the first integrated device 202 and the second integrated device 204. The opening 310 is located over the first integrated device 202 and the first TIM 205. The opening 310 is configured to allow coupling between the step heat sink 220 and the first integrated device 202. The shield 210 may be configured to be coupled to the second TIM 206

The gasket 212 is configured to be coupled to the shield 210 (e.g., coupled to the first shield portion 210a). The TIM 214 is configured to be coupled to the shield 210 (e.g., coupled to the second shield portion 210b).

The step heat sink 220 is configured to be coupled to the first integrated device 202 through the first TIM 205. For example, the first heat sink portion 220a is configured to be coupled to the first TIM 205, which is coupled to the first integrated device 202. The step heat sink 220 is further configured to be coupled to the shield 210 (e.g., through the gasket 212 and/or the TIM 214). For example, the first heat sink portion 220a is configured to be coupled to the gasket 212, and the second heat sink portion 220b is configured to be coupled to the TIM 214.

The heat pipe 230 is configured to be coupled to the step heat sink 220. In some implementations, the heat pipe 230 is configured to be coupled to the first heat sink portion 220a, such that the heat pipe 230 is located over the first integrated device 202.

Various implementations may use various materials, parts and/or components with various dimensions and/or properties. For example, the thermal interface materials (TIMs) may have a thermal conductivity value (k) in a range of approximately 1-3 Watts per meter kelvin (W/(mk)). The shield 210 may have a thermal conductivity value (k) a range of approximately 40-200 W/(mk). The step heat sink 220 may have a thermal conductivity value (k) a range of approximately 200-400 W/(mk).

The first TIM 205 may have a thickness in a range of approximately 0.02-0.2 millimeters (mm). The second TIM 206 may have a thickness in a range of approximately 0.15-0.2 mm. The TIM 214 may have a thickness in a range of approximately 0.15-0.2 mm. The first heat sink portion 220a and/or the second heat sink portion 220b may have a thickness of approximately 0.5 mm. The heat pipe 230 may have a thickness of approximately 0.5 mm.

The first TIM 205 may include grease in liquid phase. The second TIM 206 and/or the TIM 214 may include a silicon based thermal pad. The shield 210 may include an electrically conductive material (e.g., Al, Iron, Steel). The step heat sink 220 may include an electrically conductive material (e.g., Cu, gold, silver).

It is noted that the dimensions and materials described above may be applicable to any of the assemblies, TIMs, substrate, shields, heat sinks, and/or heat pipes described in the disclosure.

Exemplary Assembly Comprising Integrated Devices and a Step Heat Sink

As mentioned above, different implementations may include different configurations of an assembly having integrated devices and a step heat sink. FIGS. 4 and 5 illustrate another assembly 400. The assembly 400 is similar to the assembly 200 of FIGS. 2 and 3, and thus includes similar components and arrangements as the assembly 200.

As shown in FIGS. 4 and 5, the assembly 400 includes the substrate 201, the first integrated device 202, the second integrated device 204, the plurality of solder interconnects 203, the first TIM 205, the second TIM 206, a frame 407, the shield 410, a TIM 412, the TIM 214, a step heat sink 420, and the heat pipe 230.

The frame 407 is similar to the frame 207. The shield 410 is similar to the shield 210. However, the shield 410 does not include an opening (e.g., 310). The TIM 412 is similar to the TIM 214. The step heat sink 420 is similar to the step heat sink 220. However, the step heat sink 420 does not include a protrusion as illustrated by the step heat sink 220 of FIGS. 2 and 3.

As shown in FIGS. 4 and 5, the first integrated device 202 and the second integrated device 204 are coupled to the substrate 201. The second integrated device 204 is coupled to the substrate 201 through a plurality of solder interconnects 203 (e.g., LGA). The first TIM 205 is coupled to a top portion (e.g., back side) of the first integrated device 202. The second TIM 206 is coupled to a top portion (e.g., back side) of the second integrated device 204. The frame 407 is configured to be coupled to the substrate 201 such that the frame 407 at least partially surrounds (e.g., laterally surrounds) the first integrated device 202 and the second integrated device 204.

The shield 410 is configured to be coupled to the frame 407 such that the shield 410 is located over the first integrated device 202 and the second integrated device 204. The shield 410 may be configured to be coupled to the first TIM 205 and the second TIM 206. The TIM 412 is configured to be coupled to the shield 410 (e.g., coupled to the first shield portion 410a). The TIM 214 is configured to be coupled to the shield 410 (e.g., coupled to the second shield portion 410b).

The step heat sink 420 is configured to be coupled to the first integrated device 202 through the TIM 412, the shield 410 and the first TIM 205. For example, the first heat sink portion 420a is configured to be coupled to the TIM 412, which is coupled to the shield 410. The shield 410 is coupled to the first TIM 205, which is coupled to the first integrated device 202. The second heat sink portion 420b is configured to be coupled to the TIM 214.

The heat pipe 230 is configured to be coupled to the step heat sink 420. In some implementations, the heat pipe 230 is configured to be coupled to the first heat sink portion 420a, such that the heat pipe 230 is located over the first integrated device 202.

Exemplary Assembly Comprising Integrated Devices and a Step Heat Sink

FIGS. 6 and 7 illustrate another assembly 600. The assembly 600 is similar to the assembly 200 of FIGS. 2 and 3, and thus includes similar components and arrangements as the assembly 200.

As shown in FIGS. 6 and 7, the assembly 600 includes the substrate 201, the first integrated device 202, the second integrated device 204, the plurality of solder interconnects 203, the first TIM 205, the second TIM 206, a frame 607, the shield 610, a gasket 612, the TIM 214, a step heat sink 620, and the heat pipe 230.

The frame 607 is similar to the frame 207. The shield 610 is similar to the shield 210. However, the shield 610 is configured to be located over the second integrated device 204. The gasket 612 is similar to the gasket 212. The step heat sink 620 may be similar to the step heat sink 420.

As shown in FIGS. 6 and 7, the first integrated device 202 and the second integrated device 204 are coupled to the substrate 201. The second integrated device 204 is coupled to the substrate 201 through a plurality of solder interconnects 203 (e.g., LGA). The first TIM 205 is coupled to a top portion (e.g., back side) of the first integrated device 202. The second TIM 206 is coupled to a top portion (e.g., back side) of the second integrated device 204. The frame 607 is configured to be coupled to the substrate 201 such that the frame 607 at least partially surrounds (e.g., laterally surrounds) the first integrated device 202 and the second integrated device 204.

The shield 610 is configured to be coupled to the frame 607 such that the shield 610 is located over the second integrated device 204. The shield 610 may be configured to be coupled to the second TIM 206.

The gasket 612 is configured to be coupled to the frame 607. The TIM 214 is configured to be coupled to the shield 610.

The step heat sink 620 is configured to be coupled to the first integrated device 202 through the first TIM 205. For example, the first heat sink portion 620a is configured to be coupled to the first TIM 205, which is coupled to the first integrated device 202. The step heat sink 620 is configured to be coupled to the shield 610. For example, the second heat sink portion 620b is configured to be coupled to the TIM 214, which is coupled to the shield 610.

The heat pipe 230 is configured to be coupled to the step heat sink 620. In some implementations, the heat pipe 230 is configured to be coupled to the first heat sink portion 620a, such that the heat pipe 230 is located over the first integrated device 202.

FIG. 8 illustrates a device 800 that includes an assembly having integrated devices, a shield and a step heat sink. The device 800 may be a computer device, such as a laptop or a tablet. The device 800 includes a case 810 and a screen portion 820. The case 810 is configured to store various components, such as an assembly, a board, integrated devices, energy storage device (e.g., battery), a storage device (e.g., solid state device (e.g., SSD)). The case 810 may include input/output devices, such as a keyboard.

As shown in FIG. 8, the assembly 200 is implemented with the device 800 such that the assembly is located within the case 810 of the device 800. FIG. 8 illustrates that the substrate (e.g., 201) facing side of the assembly 200 faces the keyboard side 260 of a device 800, while the step heat sink (e.g., 220) facing side of the assembly 200 faces the bottom side 270 of the device 800. However, different implementations may implement the assembly in a device differently (e.g., different location, different orientation, different configuration). In some implementations, the assembly 200 may be implemented in the screen portion 820 of the device 800. In such an instance, the substrate (e.g., 201) facing side of the assembly 200 may face the screen side of a device 800, while the step heat sink (e.g., 220) facing side of the assembly 200 may face the back side of the screen portion 820 of the device 800. Any of the assemblies (e.g., 400, 600) described in the disclosure may be implemented with the device 800 in a similar manner or a different manner.

FIGS. 9 and 10 illustrate graphs that show heat dissipating performances when using a non-step heat sink and when using a step heat sink. The graph 900 illustrates a temperature profile (e.g., junction temperature profile) of an integrated device, a bottom surface temperature profile of a device, and a top surface temperature profile (e.g., a keyboard surface temperature profile) of the device, when a non-step heat sink is implemented with a device. The graph 1000 illustrates a temperature profile (e.g., junction temperature profile) of an integrated device (e.g., first integrated device 202), a bottom surface temperature profile of a device, and top surface temperature profile (e.g., a keyboard surface temperature profile) of the device, when a step heat sink (e.g., 220, 420, 620) is implemented with the device (e.g., 800).

The graph 900 illustrates that within 40 seconds, the junction temperature of the integrated device has risen to about 80 degree Celsius. In contrast, as shown in graph 1000, when a particular step heat sink is implemented, the junction temperature of the integrated device has risen to less than 70 degree Celsius. The graph 900 illustrates that within 140 seconds, the top surface temperature (e.g., keyboard surface temperature) has reached 42 degree Celsius (which is the normal skin temperature of a human). In contrast, as shown in graph 1000, when a particular step heat sink is implemented, the top surface temperature (e.g., keyboard surface temperature) does not reach 42 degree Celsius until at least about 200 seconds. With the particular step heat sink, the integrated device may not need to be throttled until 200 seconds.

FIG. 10 illustrates that the use of a step heat sink (e.g., 220, 420, 620) provides better heat dissipation of integrated devices (e.g., 202), while also reducing the rate at which the surface temperatures of a devices increases, thereby making the device more comfortable for a user of the device. It is noted that the shield (e.g., 210, 410, 610), the substrate 201 and/or the board 240 may be configured to help dissipate heat away from the integrated device(s) and spread out the heat in a greater area, which helps reduce the surface temperatures of a device that includes the step heat sink, the shield, the substrate, and/or the board 240. As shown in FIG. 10, the particular design of the step heat sink that is used for the graph is such that the temperature change at the top surface of the device is approximately the same as the temperature change at the bottom surface of the device. However, different implementations of the step heat sink may provide different results in how and where heat is dissipated from a heat generating region (e.g., region that includes an integrated device).

Having described various assemblies having a shield and a step heat sink, sequences for fabricating a step heat sink and a shield will now be described below.

Exemplary Sequence for Fabricating a Step Heat Sink

FIG. 11 illustrates an exemplary sequence for providing or fabricating a step heat sink. In some implementations, the sequence of FIG. 11 may be used to provide or fabricate the step heat sink of FIGS. 2 and 3, or any of the step heat sink described in the disclosure. However, the sequence of FIG. 11 may be used to fabricate any of the step heat sinks described in the disclosure.

It should be noted that the sequence of FIG. 11 may combine one or more stages in order to simplify and/or clarify the sequence for providing or fabricating the step heat sink. In some implementations, the order of the processes may be changed or modified. In some implementations, one or more of processes may be replaced or substituted without departing from the spirit of the disclosure. However, different implementations may fabricate a step heat sink differently.

Stage 1 illustrates a state after a thermally conductive material 1100 is provided. The thermally conductive material 1100 may have high thermal conductivity value (k) (e.g., 200 W/(mk) or higher), such as copper. Different implementations may use different material(s) for the thermally conductive material 1100. In some implementations, the thermally conductive material 1100 may be an alloy.

Stage 2 illustrates a state after a portion 1102 of the thermally conductive material 1100 has been removed. A mechanical process may be used to remove the portion 1102. For example, a milling machine may be used to remove the portion 1102.

Stage 3 illustrates a state after portions 1104a and 1104b of the thermally conductive material 1100 has been removed. A mechanical process (e.g., milling process) may be used to remove the portions 1104a and 1104b. As shown in FIG. 3, a protrusion 222 is formed in the step heat sink 220.

In some implementations, a stamping process may be used to form the step heat sink 220. Depending on the material(s) that is used for the step heat sink (e.g., 220), a milling process or stamping process may be used to fabricate the step heat sink. An example of a stamping process is illustrated and described in FIG. 12. The stamping process of FIG. 12 may be used to fabricate the step heat sink (e.g., 220). The step heat sink (e.g., 220) may be unibody step heat sink or may include several components to form the step heat sink.

Exemplary Sequence for Fabricating a Step Shield

FIG. 12 illustrates an exemplary sequence for providing or fabricating a step shield. In some implementations, the sequence of FIG. 12 may be used to provide or fabricate the step shield of FIGS. 2 and 3, or any of the step shield described in the disclosure. However, the sequence of FIG. 12 may be used to fabricate any of the step shields described in the disclosure.

It should be noted that the sequence of FIG. 12 may combine one or more stages in order to simplify and/or clarify the sequence for providing or fabricating the step shield. In some implementations, the order of the processes may be changed or modified. In some implementations, one or more of processes may be replaced or substituted without departing from the spirit of the disclosure. However, different implementations may fabricate a step shield differently.

Stage 1 illustrates a state after an electrically conductive material 1200 is provided. The electrically conductive material 1200 may also be a thermally conductive material that has a thermal conductivity value (k) of approximately of 40 W/(mk) or higher. The electrically conductive material 1200 may include a metal.

Stage 2 illustrates a state after portions 1202 (e.g., 1202a, 1202b, 1202c) of the electrically conductive material 1200 have been removed. A mechanical process (e.g., stamping process) may be used to remove the portions 1202 (e.g., 1202a, 1202b, 1202c).

Stage 3 illustrates a state after portions of the material 1200 are folded to form the first shield portion 210a, the second shield portion 210b and the third shield portion 210c. A mechanical process (e.g., a stamping process) may be used to form the shield portions 210a, 210b, and the 210c.

Stage 4 illustrates a state after portions of the material 1200 are further folded to form side walls for the shield 210. In some implementations, a stamping process may be used to form the side walls. Different implementations may fold the material 1200 differently. The shield (e.g., 210) may be unibody step shield or may include several components to form the step shield.

Exemplary Sequence for Fabricating an Assembly Comprising an Integrated Device, a Step Heat Sink and a Shield FIGS. 13A-13D illustrate an exemplary sequence for providing or fabricating an assembly that includes a step heat sink and a shield. In some implementations, the sequence of FIGS. 13A-13D may be used to provide or fabricate the assembly 200 of FIG. 3, or any of the assemblies described in the disclosure.

It should be noted that the sequence of FIGS. 13A-13D may combine one or more stages in order to simplify and/or clarify the sequence for providing or fabricating the assembly that includes a step heat sink and a shield. In some implementations, the order of the processes may be changed or modified. In some implementations, one or more of processes may be replaced or substituted without departing from the spirit of the disclosure. However, different implementations may fabricate an assembly differently.

Figure 13A:
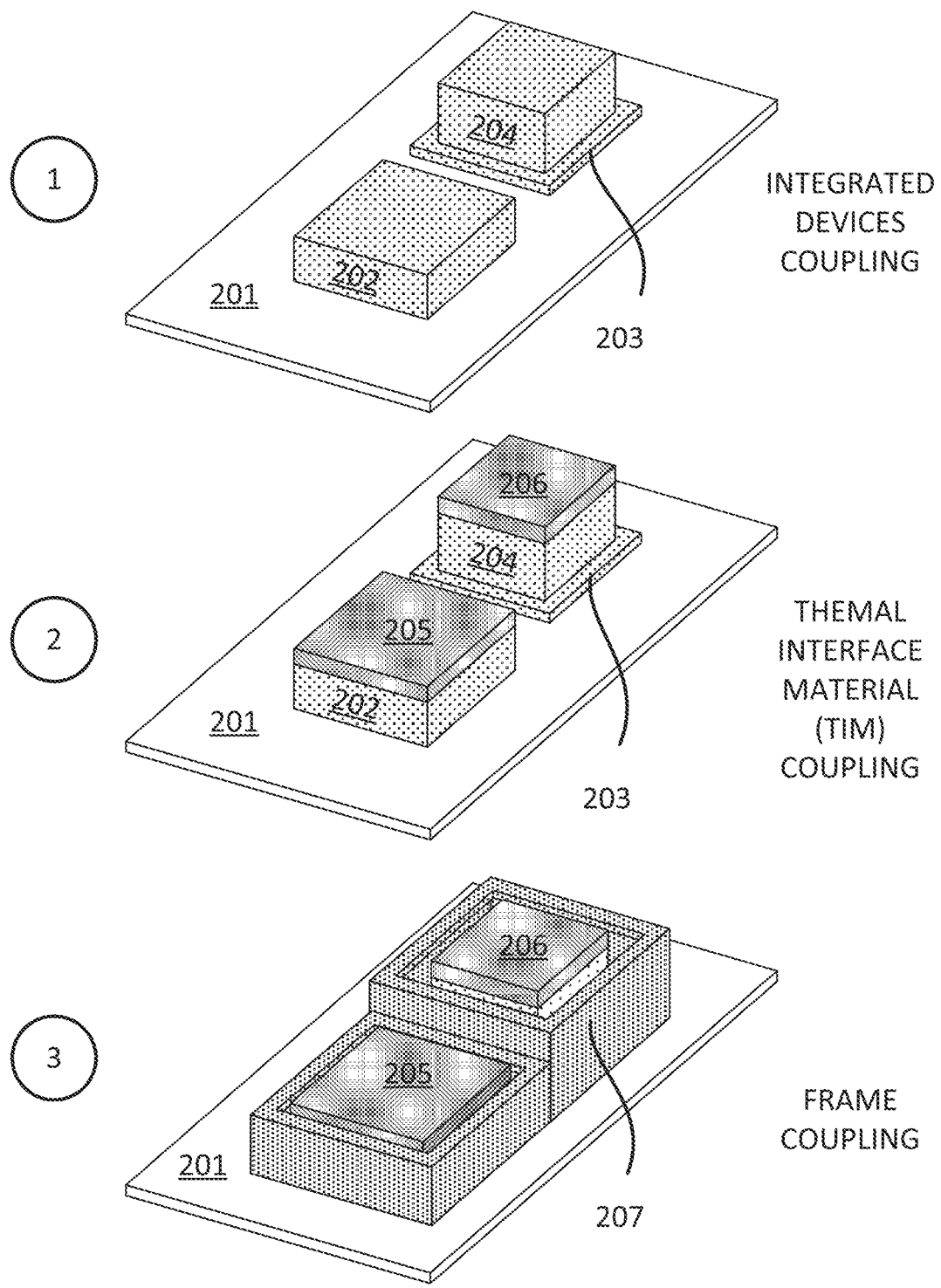

Stage 1, as shown in FIG. 13A, illustrates a state after the first integrated device 202 and the second integrated device 204 are coupled to the substrate 201. The substrate 201 may be a laminate substrate. The first integrated device 202 and the second integrated device 204 may be coupled to the substrate 201 through a plurality of interconnects. For example, the second integrated device 204 may be coupled to the substrate 201 through a plurality of solder interconnects 203 (e.g., LGA).

Stage 2 illustrates a state after the first TIM 205 is coupled to the first integrated device 202, and the second TIM 206 is coupled to the second integrated device 204. The first TIM 205 may be disposed over a back side of the first integrated device 202, and the second TIM 206 may be disposed over a back side of the second integrated device 204.

Stage 3 illustrates a state after the frame 207 is coupled to the substrate 201. A solder and/or an adhesive may be used to couple to the frame 207 to the substrate 201. However, different implementations may use different processes and/ or components to couple the frame 207 to the substrate 201.

Figure 13B:
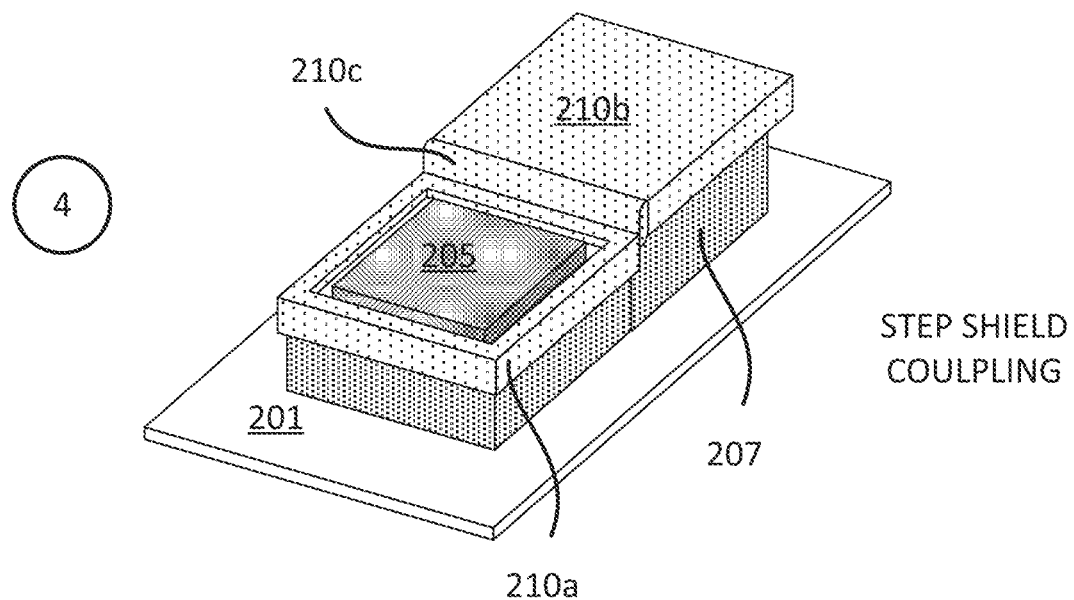
Figure 13B:
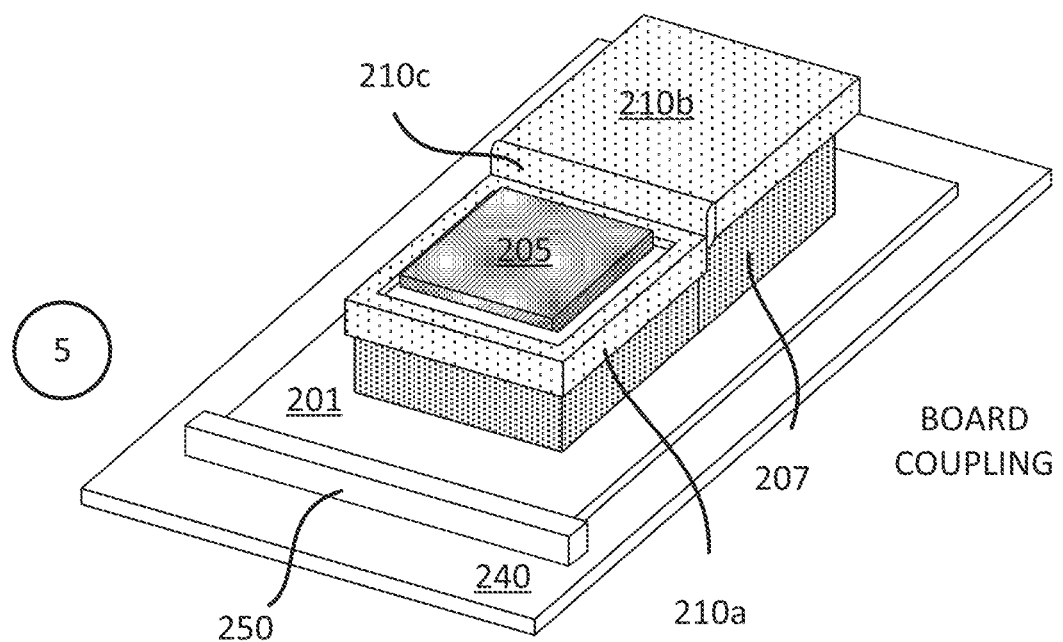

Stage 4, as shown in FIG. 13B, illustrates a state after the shield 210 is coupled to the frame 207. A solder and/or an adhesive may be used to couple to the shield 210 to the frame 207. However, different implementations may use different processes and/or components to couple the shield 210 to the frame 207. The shield 210 may be a step shield. The shield 210 is coupled to the frame 207 such that the first shield portion 210a is located over the first integrated device 202 and the second shield portion 210b is located over the second integrated device 204.

Stage 5 illustrates a state after the substrate 201 is coupled to the board 240. The board 240 may include a printed circuit board (PCB). The substrate 201 may be part of the assembly 200. As such, Stage 5 may illustrate the assembly 200 being coupled to the board 240. The substrate 201 and/or the assembly 200 may be coupled to the board 240 through the connector 250. The connector 250 may be a M.2 module compatible connector. For example, the substrate 201 may include interconnects (e.g., pins) that may be coupled to the connector 250.

Figure 13C:
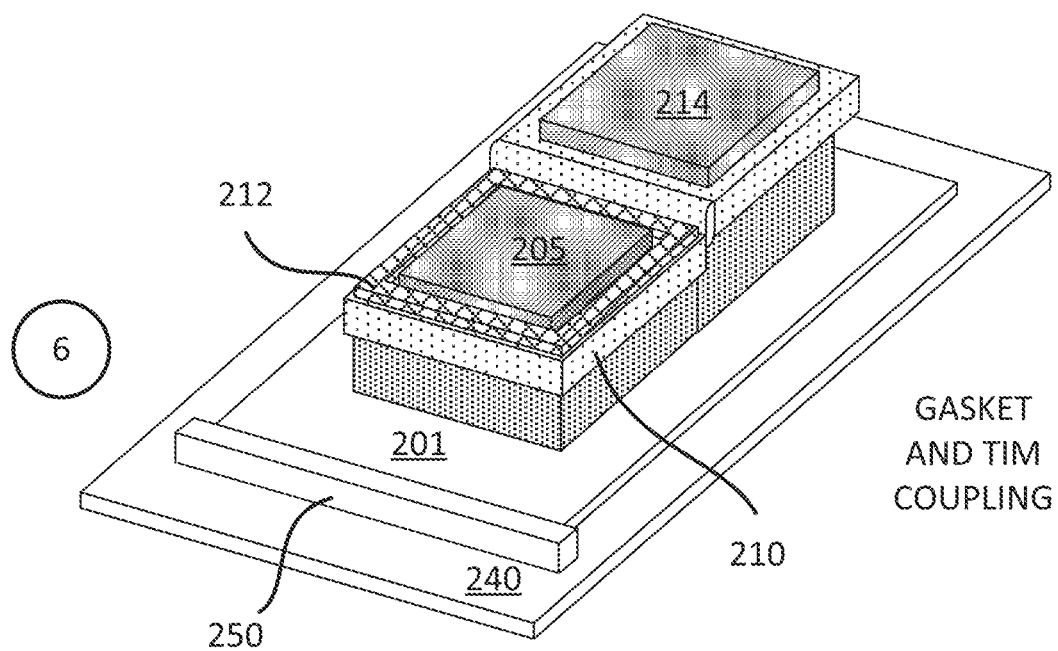
Figure 13C:
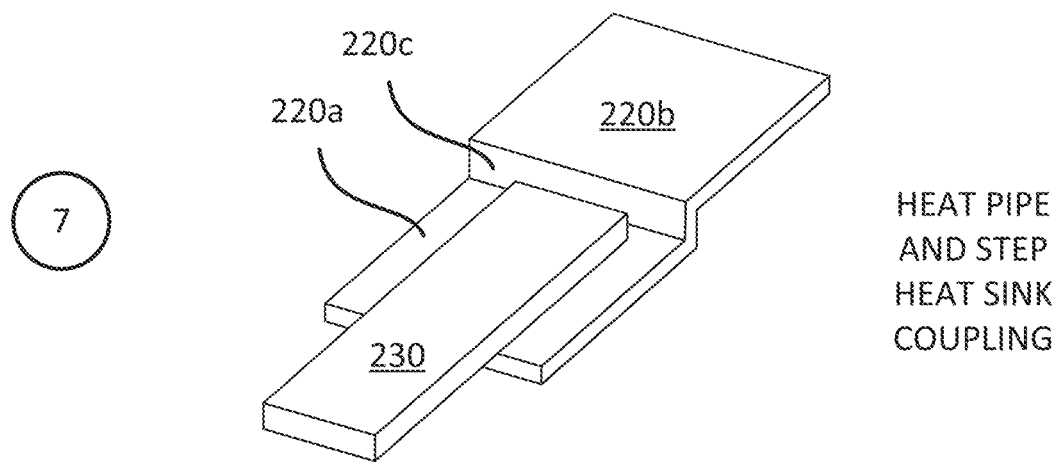

Stage 6, as shown in FIG. 13C, illustrates a state after the gasket 212 is coupled to the shield 210, and the TIM 214 is coupled to the shield 210. The gasket 212 is coupled to the first shield portion 210a, and the TIM 214 is coupled to the second shield portion 210b.

Stage 7 illustrates a state after the heat pipe 230 is coupled to the step heat sink 220. The heat pipe 230 may be coupled to the first heat sink portion 220a.

Figure 13D:
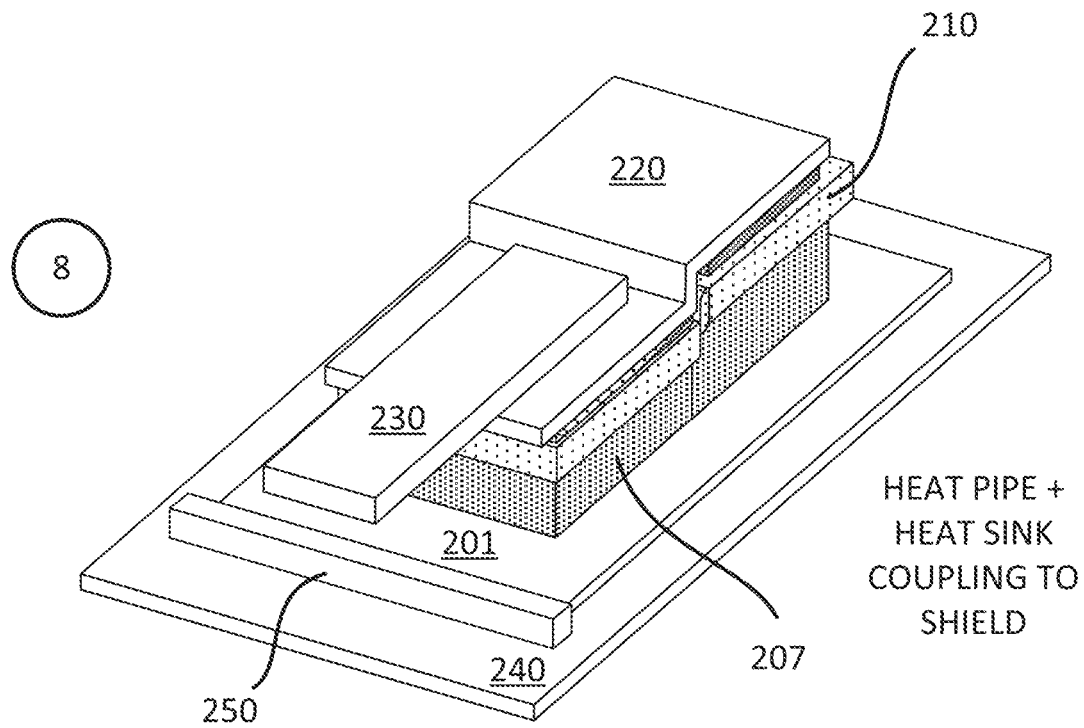

Stage 8, as shown in FIG. 13D, illustrates a state after the heat pipe 230 and the step heat sink 220 are coupled to the shield 210. The step heat sink 220 is coupled to the first TIM 205, the gasket 212, and the TIM 214. The first heat sink portion 220a is located over the first integrated device 202. The heat pipe 230 is located over the first integrated device 202. In some implementations, Stage 8 may illustrate the assembly 200.

Exemplary Flow Diagram of a Method for Fabricating an Assembly Comprising an Integrated Device, a Step Heat Sink and a Shield In some implementations, fabricating an assembly that includes a step heat sink and a shield includes several processes. FIG. 14 illustrates an exemplary flow diagram of a method 1400 for providing or fabricating an assembly that includes a step heat sink and a shield. The method 1400 of FIG. 14 may be used to provide or fabricate the assembly 200 of FIGS. 2 and 3 described in the disclosure. However, the method 1400 may be used to provide or fabricate any of the assemblies described in the disclosure.

It should be noted that the sequence of FIG. 14 may combine one or more processes in order to simplify and/or clarify the method for providing or fabricating an assembly that includes a step heat sink and a shield. In some implementations, the order of the processes may be changed or modified. In some implementations, one or more processes may be replaced or substituted without departing from the spirit of the disclosure. Different implementations may fabricate an assembly differently.

The method couples (at 1405) the first integrated device 202 and the second integrated device 204 to the substrate 201. The substrate 201 may be a laminate substrate. The first integrated device 202 and the second integrated device 204 may be coupled to the substrate 201 through a plurality of interconnects. For example, the second integrated device 204 may be coupled to the substrate 201 through a plurality of solder interconnects 203 (e.g., LGA). Stage 1 of FIG. 13A illustrates and describes an example of integrated devices coupled to a substrate.

The method couples (at 1410) the first TIM 205 to the first integrated device 202, and the second TIM 206 to the second integrated device 204. The first TIM 205 may be disposed over a back side of the first integrated device 202, and the second TIM 206 may be disposed over a back side of the second integrated device 204. Stage 2 of FIG. 13A illustrates and describes an example of TIMs being coupled to integrated devices.

The method couples (at 1415) the frame 207 to the substrate 201. A solder and/or an adhesive may be used to couple to the frame 207 to the substrate 201. However, different implementations may use different processes and/or components to couple the frame 207 to the substrate 201. Stage 3 of FIG. 13A illustrates and describes an example of a frame coupled to a substrate.

The method couples (at 1420) the shield 210 to the frame 207. A solder and/or an adhesive may be used to couple to the shield 210 to the frame 207. However, different implementations may use different processes and/or components to couple the shield 210 to the frame 207. The shield 210 may be a step shield. The shield 210 is coupled to the frame 207 such that the first shield portion 210a is located over the first integrated device 202 and the second shield portion 210b is located over the second integrated device 204. Stage 4 of FIG. 13B illustrates and describes an example of a shield coupled to a frame.

The method couples (at 1425) an assembly to the board 240. The method may couple the substrate 201 to the board 240. The board 240 may include a printed circuit board (PCB). The substrate 201 may be part of the assembly 200. The substrate 201 and/or the assembly 200 may be coupled to the board 240 through the connector 250. The connector 250 may be a M.2 module compatible connector. Stage 5 of FIG. 13B illustrates and describes an example of an assembly coupled to a board.

The method couples (at 1430) the gasket 212 to the shield 210, and the TIM 214 to the shield 210. The gasket 212 may be coupled to the first shield portion 210a, and the TIM 214 may be coupled to the second shield portion 210b. Stage 6 of FIG. 13C illustrates and describes an example of a gasket and a TIM coupled to a shield.

The method couples (at 1435) the heat pipe 230 to the step heat sink 220. The heat pipe 230 may be coupled to the first heat sink portion 220a. Stage 7 of FIG. 13C illustrates and describes an example of a heat pipe coupled to a step heat sink.

The method couples (at 1440) the heat pipe 230 and the step heat sink 220 to the shield 210. The step heat sink 220 may be coupled to the first TIM 205, the gasket 212, and the TIM 214. The first heat sink portion 220a may be located over the first integrated device 202. The heat pipe 230 may be located over the first integrated device 202. Stage 8 of FIG. 13D illustrates and describes an example of a heat pipe and a step heat sink coupled to the shield.

Exemplary Electronic Devices

FIG. 15 illustrates various electronic devices that may be integrated with any of the aforementioned assembly, heat sink, shield, heat pipe, device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1502, a laptop computer device 1504, a fixed location terminal device 1506, a wearable device 1508, or automotive vehicle 1510 may include a device 1500 as described herein. The device 1500 may be, for example, any of the devices and/or packages described herein. The electronic devices 1502, 1504, 1506 and 1508 and the vehicle 1510 illustrated in FIG. 15 are merely exemplary. Other electronic devices may also feature the device 1500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-8, 11-12, 13A-13D, and/or 14-15 may be rearranged and/or combined into a single component, process, feature or function or embodied in several components, processes, or functions. Additional elements, components, processes, and/or functions may also be added without departing from the disclosure. It should also be noted FIGS. 2-8, 11-12, 13A-13D, and/or 14-15 and its corresponding description in the present disclosure is not limited to dies and/or ICs. In some implementations, FIGS. 2-8, 11-12, 13A-13D, and/or 14-15 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The term "surround" means that the object may partially surround or completely surround another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, (e.g., depending on how a bottom or top may be arbitrarily defined). In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An assembly comprising:
a substrate;
a first integrated device coupled to the substrate;
a second integrated device coupled to the substrate;
a first thermal interface material (TIM) coupled to the first integrated device;
a second thermal interface material (TIM) coupled to the second integrated device;
a frame coupled to the substrate,
wherein the frame at least partially surrounds the first integrated device and the second integrated device,
wherein the frame is configured to provide a first compartment and a second compartment,
wherein at least part of the frame is located between the first integrated device and the second integrated device, and
wherein the frame is coupled to the substrate such that (i) the first integrated device is located in the first component of the frame and (ii) the second integrated device is located in the second compartment of the frame;
a shield coupled to at least part of the frame located between the first integrated device and the second integrated device;
a step heat sink coupled to the frame,
wherein the step heat sink is located over the first integrated device and the second integrated device,
wherein the step heat sink comprises:
a first heat sink portion;
a third heat sink portion coupled to the first heat sink portion; and
a second heat sink portion coupled to the third heat sink portion; and
a heat pipe coupled to the step heat sink,
wherein the heat pipe is located over (i) the first integrated device and (ii) the first heat sink portion of the step heat sink, and
wherein the heat pipe and the second heat sink portion of the step heat sink are located in a same horizontal plane.

2. The assembly of claim 1,
wherein the third heat sink portion is located between the first heat sink portion and the second heat sink portion,
wherein the second heat sink portion and the first heat sink portion are located in different horizontal planes, and
wherein the second heat sink portion is located over the second integrated device.

3. The assembly of claim 2, wherein the first heat sink portion, the second heat sink portion and the third heat sink portion are contiguous portions and/or continuous portions.

4. The assembly of claim 2, wherein the first heat sink portion, the second heat sink portion and the third heat sink portion include at least two separate portions.

5. The assembly of claim 1, wherein the shield is located between the frame and the step heat sink.

6. The assembly of claim 5, wherein the shield includes a step shield.

7. The assembly of claim 6, wherein the step shield includes:
a first shield portion;
a third shield portion coupled to the first shield portion; and
a second shield portion coupled to the third shield portion,
wherein the third shield portion is located between the first shield portion and the second shield portion, and
wherein the second shield portion and the first shield portion are located in different horizontal planes.

8. The assembly of claim 1, further comprising a gasket, wherein the step heat sink is coupled to the frame through the gasket.

9. The assembly of claim 1,
wherein the first thermal interface material (TIM) is coupled to the first integrated device and the shield; and
wherein the second thermal interface material (TIM) is coupled to the second integrated device and the shield.

10. The assembly of claim 1,
wherein the first TIM is further coupled to the step heat sink,
wherein the step heat sink extends through an opening in the shield, and
wherein the step heat sink is coupled to the frame through at least one solder interconnect.

11. The assembly of claim 1, wherein the step heat sink is configured to provide electromagnetic interference (EMI) shielding.

12. The assembly of claim 1, further comprising a gasket coupled to the frame and the step heat sink.

13. The assembly of claim 1, wherein the first integrated device comprises a radio frequency (RF) device, a die, an integrated device, a passive device, a filter, a capacitor, an inductor, an antenna, a transmitter, a receiver, and/or combinations thereof.

14. The assembly of claim 1, wherein the assembly is implemented in a computer device such that a step heat sink side of the assembly faces a bottom side of the computer device and a substrate side of the assembly faces a keyboard side of the computer device.

15. The assembly of claim 1, wherein the assembly is incorporated into a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

16. An apparatus comprising:
a substrate;
a first integrated device coupled to the substrate;
a second integrated device coupled to the substrate;
a frame coupled to the substrate,
wherein the frame at least partially surrounds the first integrated device and the second integrated device,
wherein the frame is configured to provide a first compartment and a second compartment,
wherein at least part of the frame is located between the first integrated device and the second integrated device, and
wherein the frame is coupled to the substrate such that (i) the first integrated device is located in the first component of the frame and (ii) the second integrated device is located in the second compartment of the frame, and
wherein the frame is configured to provide electromagnetic interference (EMI) shielding between the first integrated device and the second integrated device;
means for shielding coupled to at least part of the frame located between the first integrated device and the second integrated device;
means for heat dissipation coupled to the frame, wherein the means for heat dissipation is located over the first integrated device and the second integrated device, and wherein the means for heat dissipation comprises:

a first heat sink portion;

a third heat sink portion coupled to the first heat sink portion; and a second heat sink portion coupled to the third heat sink portion; and means for phase transition heat dissipation coupled to the means for heat dissipation, wherein the means for phase transition heat dissipation is located over (i) the first integrated device and (ii) the first heat sink portion of the means for heat dissipation, and wherein the means for phase transition heat dissipation and the second heat sink portion of the means for heat dissipation are located in a same horizontal plane.

17. The apparatus of claim 16, wherein the third heat sink portion is located between the first heat sink portion and the second heat sink portion, and wherein the second heat sink portion and the first heat sink portion are located in different horizontal planes.

18. The apparatus of claim 17, wherein the first heat sink portion, the second heat sink portion and the third heat sink portion are contiguous portions and/or continuous portions.

19. The apparatus of claim 17, wherein the first heat sink portion, the second heat sink portion and the third heat sink portion include at least two separate portions.

20. The apparatus of claim 16, wherein the means for shielding is located between the frame and the means for heat dissipation.

21. The apparatus of claim 20, wherein the means for shielding includes a step shield.

22. The apparatus of claim 21, wherein the step shield includes:

a first shield portion;

a third shield portion coupled to the first shield portion; and a second shield portion coupled to the third shield portion, wherein the third shield portion is located between the first shield portion and the second shield portion, and wherein the second shield portion and the first shield portion are located in different horizontal planes.

23. The apparatus of claim 16, wherein the second heat sink portion extends between the first heat sink portion and the third heat sink portion of the means for heat dissipation.

24. The apparatus of claim 16, further comprising:

a first thermal interface material (TIM) coupled to the first integrated device and the means for heat dissipation; and a second thermal interface material (TIM) coupled to the second integrated device;

wherein the means for heat dissipation extends through an opening in the means for shielding.

25. The apparatus of claim 16, further comprising:

a board; and a connector coupled to the substrate, wherein the connector is configured to electrically couple the substrate to the board.

26. The apparatus of claim 16, wherein the means for heat dissipation is further configured to provide electromagnetic interference (EMI) shielding.

27. The apparatus of claim 16, further comprising a gasket coupled to the frame and the means for heat dissipation.

28. The apparatus of claim 16, wherein the first integrated device comprises a radio frequency (RF) device, a die, an integrated device, a passive device, a filter, a capacitor, an inductor, an antenna, a transmitter, a receiver, and/or combinations thereof.

29. The apparatus of claim 16, wherein the substrate, the first integrated device, the second integrated device, the frame, and the means for heat dissipation is part of an assembly, wherein the apparatus includes a computer device, and wherein a step heat sink side of the assembly faces a bottom side of the computer device and a substrate side of the assembly faces a keyboard side of the computer device.

30. The apparatus of claim 16, wherein the apparatus includes a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *